(12) United States Patent
Williams et al.

(10) Patent No.: US 7,924,413 B2
(45) Date of Patent: Apr. 12, 2011

(54) NANOWIRE-BASED PHOTONIC DEVICES

(75) Inventors: R. Stanley Williams, Portola Valley, CA (US); Shih-Yuan Wang, Palo Alto, CA (US); Philip J. Kuekes, Menlo Park, CA (US); Theodore I. Kamins, Palo Alto, CA (US); Duncan Stewart, Menlo Park, CA (US); Alexandre M. Bratkovski, Mountain View, CA (US); Jason Blackstock, Cambridge, MA (US); Zhiyong Li, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 520 days.

(21) Appl. No.: 12/074,133

(22) Filed: Feb. 29, 2008

(65) Prior Publication Data
US 2008/0218740 A1    Sep. 11, 2008

Related U.S. Application Data

(63) Continuation-in-part of application No. 11/413,375, filed on Apr. 28, 2006, now Pat. No. 7,465,954.

(51) Int. Cl.
*G01N 21/00*    (2006.01)
(52) U.S. Cl. ........... 356/72; 356/432; 356/433; 356/435

(58) Field of Classification Search .............. 356/72–73, 356/432–435; 977/957, 954; 250/227.11
See application file for complete search history.

(56) References Cited

U.S. PATENT DOCUMENTS

| 6,996,147 | B2 | 2/2006 | Majumdar et al. |
| 7,192,533 | B2 | 3/2007 | Bakkers et al. |
| 7,254,151 | B2 | 8/2007 | Lieber et al. |
| 7,256,466 | B2 | 8/2007 | Lieber et al. |
| 2002/0175408 | A1 * | 11/2002 | Majumdar et al. ............ 257/734 |
| 2006/0098705 | A1 | 5/2006 | Wang et al. |
| 2006/0280414 | A1 | 12/2006 | Beausoleil et al. |

* cited by examiner

*Primary Examiner* — Tarifur Chowdhury
*Assistant Examiner* — Abdullahi Nur

(57) ABSTRACT

Embodiments of the present invention are related to nanowire-based devices that can be configured and operated as modulators, chemical sensors, and light-detection devices. In one aspect, a nanowire-based device includes a reflective member, a resonant cavity surrounded by at least a portion of the reflective member, and at least one nanowire disposed within the resonant cavity. The nanowire includes at least one active segment selectively disposed along the length of the nanowire to substantially coincide with at least one antinode of light resonating within the cavity. The active segment can be configured to interact with the light resonating within the cavity.

20 Claims, 15 Drawing Sheets

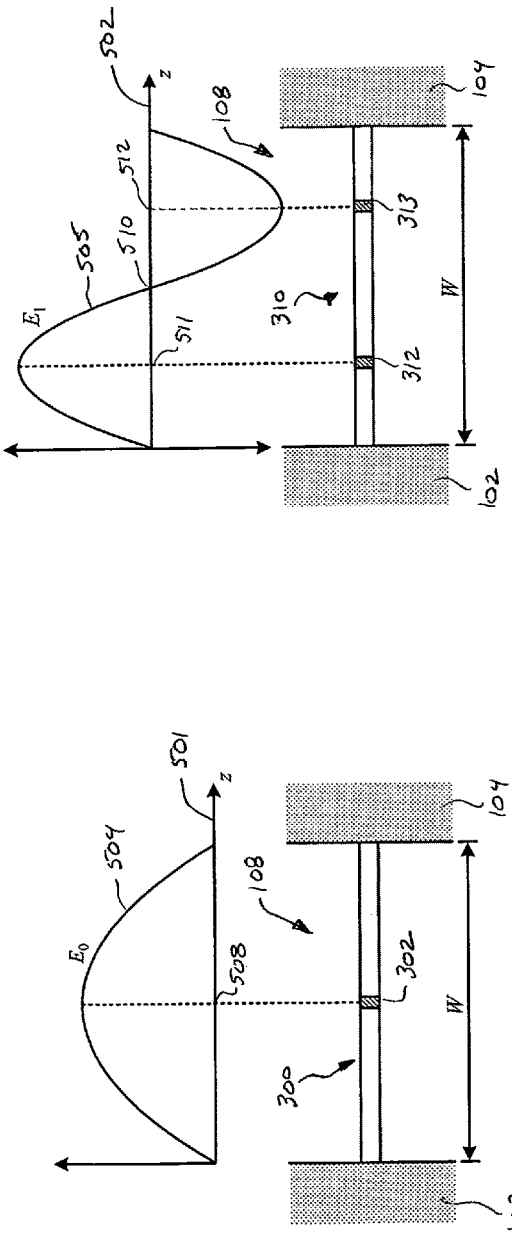
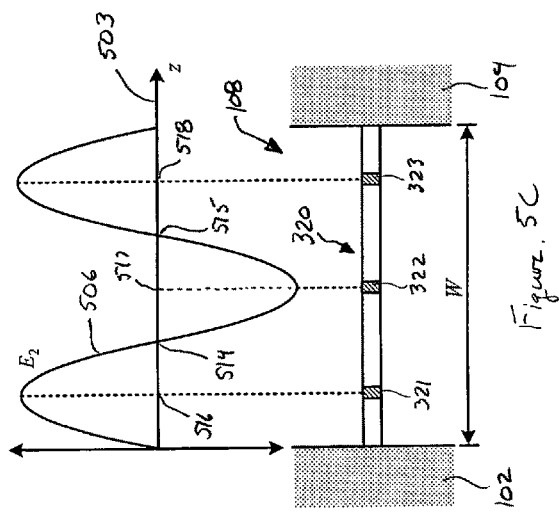
Figure 5A
Figure 5B
Figure 5C

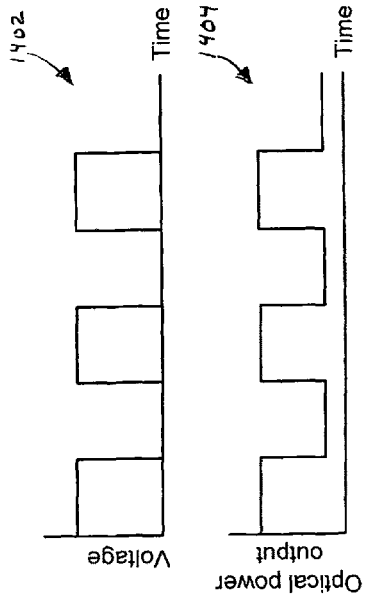
Figure 13
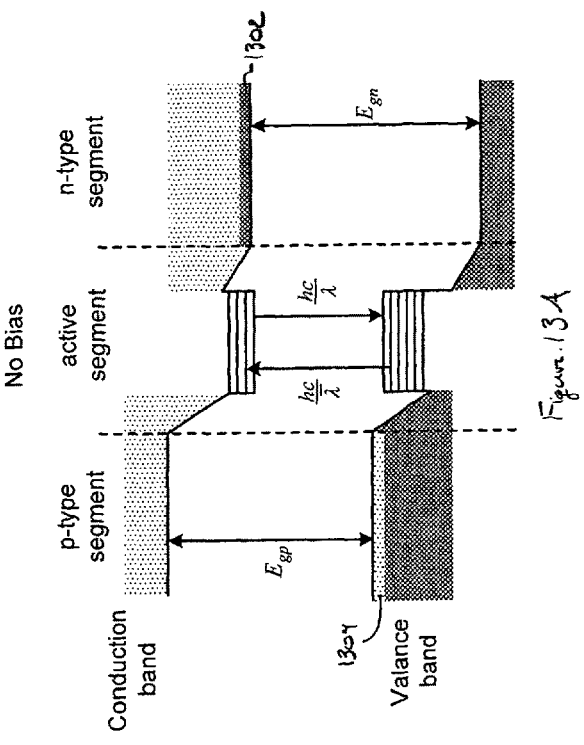
Figure 14
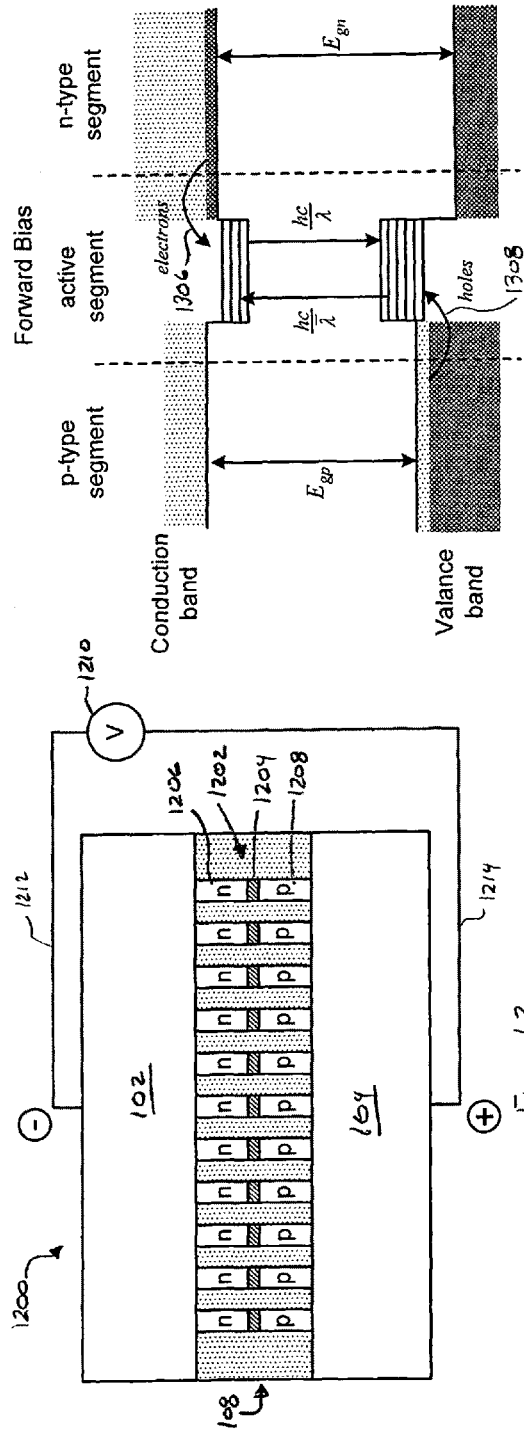
Figure 12
Figure 13A

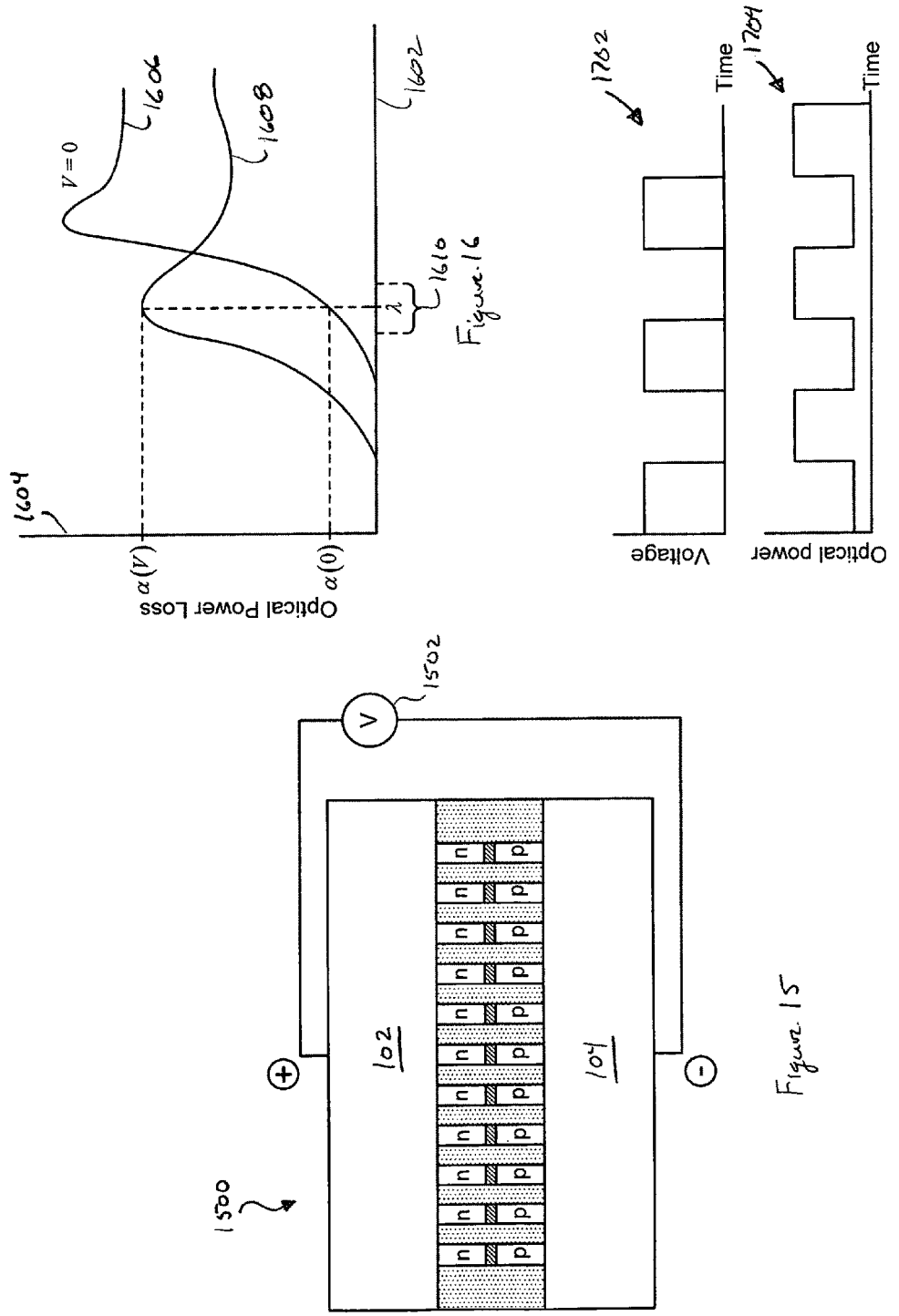

NANOWIRE-BASED PHOTONIC DEVICES

CROSS-REFERENCE TO RELATED APPLICATION

This is a continuation-in-part of application Ser. No. 11/413,375 filed on Apr. 28, 2006 now U.S. Pat. No. 7,465,954.

TECHNICAL FIELD

Embodiments of the present invention relate to nanowire-based devices. In particular, embodiments of the present invention relate to nanowires-based devices that can be configured and operated as modulators, chemical sensors, and light-detection devices.

BACKGROUND

In recent years, various nanowire-based devices have emerged with many potentially useful applications. Nanowires are wire-like structures that typically have diameters of less that about 100 nanometers and can be used as an electrical interconnection between electronic devices and in numerous other applications. One method of forming nanowires is the vapor-liquid-solid ("VLS") chemical synthesis process. Generally, this method involves depositing particles of a catalyst material such as gold or titanium on a surface of a structure on which it is desired to grow nanowires. The structure is placed in a chamber and heated to temperatures typically ranging between about 250° C. to about 1000° C. Precursor gasses including elements or compounds that will be used to form the nanowires are introduced into the chamber. The particles of the catalyst material cause the precursor gasses to at least partially decompose into their respective elements, some of which are transported on or through the particles of catalyst material and deposited on the underlying surface. As this process continues, nanowires are grown with the catalyst particle remaining on the tip or end of the nanowires. Nanowires can also be formed by physical vapor deposition or by surface atom migration.

During nanowire formation, the elements or compounds selected to form the nanowires can be varied. These nanowires are referred to as "heterostructure nanowires." In particular, a nanowire having a composition that varies along the longitudinal length of the nanowire is referred to as a "longitudinal heterostructure nanowire," and a nanowire having a radially varying composition is referred to as "coaxial heterostructure nanowire." Different regions or segments of these heterostructure nanowires can also be doped with electron donating and electron accepting impurities to form various semiconductor devices within the nanowires, such as p-n, p-i-n, p-n-p, and n-p-n junctions that can be used as diodes or field-effect transistors. However, implementing heterostructure nanowires in devices that can be employed in a wide range of other potentially useful applications remains a challenge.

SUMMARY

Embodiments of the present invention are related to nanowire-based devices that can be configured and operated as modulators, chemical sensors, and light-detection devices. In one aspect, a nanowire-based device includes a reflective member, a resonant cavity surrounded by at least a portion of the reflective member, and at least one nanowire disposed within the resonant cavity. The nanowire includes at least one active segment selectively disposed along the length of the nanowire to substantially coincide with at least one antinode of light resonating within the cavity. The active segment can be configured to interact with the light resonating within the cavity.

BRIEF DESCRIPTION OF THE DRAWINGS

FIGS. 5A-5C show disposing active segments of the nanowires shown in FIG. 3 to substantially coincide with antinodes of light intensity resonating with a cavity of a nanowire-based device in accordance with embodiments of the present invention.

FIG. 12 shows a top-view and schematic representation of a forward-bias modulator configured in accordance with embodiments of the present invention.

FIG. 13A shows an electronic energy-band diagram associated with a nanowire spanning a cavity of the forward-bias modulator, shown in FIG. 12, with no bias applied in accordance with embodiments of the present invention.

FIG. 13B shows an electronic energy-band diagram associated with a nanowire spanning a cavity of the forward-bias modulator, shown in FIG. 12, with a forward bias applied in accordance with embodiments of the present invention.

FIG. 14 shows a plot of voltage versus time and a corresponding plot of optical power output versus time for a forward-bias modulator configured in accordance with embodiments of the present invention.

FIG. 15 shows a top-view and schematic representation of a reverse-bias modulator configured in accordance with embodiments of the present invention.

FIG. 16 shows a plot of optical power loss versus a range of wavelengths for an active segment of a reverse-bias modulator configured in accordance with embodiments of the present invention.

FIG. 17 shows a plot of voltage versus time and a plot of optical power output versus time for a reverse-bias modulator configured in accordance with embodiments of the present invention.

DETAILED DESCRIPTION

Figure 1:
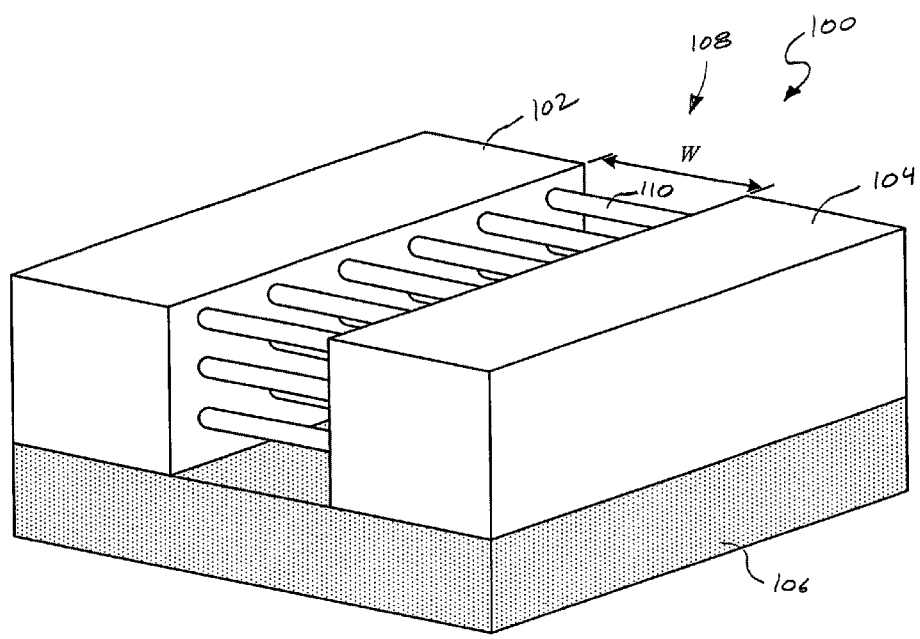
FIG. 1 shows an isometric view of a general nanowire-based device configured in accordance with embodiments of the present invention.

Various embodiments of the present invention relate to nanowire-based devices that can be configured and operated as modulators, chemical sensors, and light-detection devices. These devices each include one or more semiconductor nanowires disposed within a resonant cavity. Each nanowire includes one or more regions that interact with light called "active segments." Each active segment has a composition that can be different from the composition of adjacent segments of the nanowire. Embodiments of the present invention include selectively disposing the active segments along the length of the nanowires during nanowire fabrication. The active segments can be used as light emitters or light absorbers in a number of nanowire-based devices. Properly disposing the active segments along the length of a nanowire in relation to certain regions of light resonating within the cavity of the device enhances the properties of the device. In particular, disposing the active segments along a nanowire such that the active segments substantially coincide with the antinodes of light resonating within a resonant cavity of the device substantially maximizes the interaction of the light with the active segments and optimizes the performance of the device.

The term "active segment" can refer to portions of the nanowire that can be the same as, or include, a nano-size region of the nanowire. The length or diameter of the nano-size region can range from a few nanometers to about 300 nm. The nano-size region can be a quantum dot ("QD"), or the nano-size region can be larger in one, two, or three dimensions. A QD is a quantum size piece of material that confines electrons in all three dimensions. The small size of a QD results in electronic energy levels that can be changed by selecting the size of the QD or the material composition of the QD. Alternatively, the active segments can include nano-size regions that are too large to exhibit quantized electronic energy levels and other properties that depend on the small size of the region. For ease of discussion, these nano-size regions are sometimes broadly referred to as "quantum dots." The broader definition is used in the present application.

The term "active segment" can also refer to portions of the nanowire configured as a p-n junction or to portions of the nanowire configured as a p-i-n junction. The term "p-n junction" can refer to the boundary where the material type along the nanowire changes from p-type to n-type, can refer to the depletion region only, or can refer to the depletion region and a few minority carrier diffusion lengths into the neutral regions of the nanowire on either side of the depletion region. In the latter case, the length of the p-n junction can range from about 100 nm to about 1000 nm. The term "p-i-n junction" can refer to the intrinsic region and depletion regions within the p-type and n-type regions, and can extend a few minority carrier diffusion lengths into the neutral regions of the nanowire on either side of the intrinsic region.

The term "active segment" can also refer to various combinations of a nano-size region and p-n and p-i-n junctions. For example, an active segment can be a nano-size region configured as quantum dot that is contained within a p-n junction or p-i-n junction, or an active segment can be a nano-size region and surrounding regions of the p-n junction or p-i-n junction. The term "active segment" can also refer to a p-n junction or a p-i-n junction contained within a nano-size region of the nanowire.

The term "light" as used to describe various embodiments of the present invention is not limited to electromagnetic radiation with wavelengths that lie in the visible portion of the electromagnetic spectrum but also refers to electromagnetic radiation with wavelengths outside the visible portion, such as the infrared and ultraviolet portions. In the various embodiments described below, a number of structurally similar components have been provided with the same reference numerals and, in the interest of brevity, an explanation of their structure and function is not repeated.

I. Nanowire-Based Devices

FIG. 1 shows an isometric view of a general nanowire-based device 100 configured in accordance with embodiments of the present invention. The device 100 includes approximately parallel reflective members 102 and 104 disposed on a surface of a substrate 106 and separated to form a reflective cavity 108. The device 100 also includes a plurality of nanowires, such as nanowire 110, disposed within in the cavity 108 and positioned substantially perpendicular to the reflective members 102 and 104. The width of the cavity can be pre-selected to allow light of particular wavelengths to resonate for a period of time within the cavity 108. In particular, the relationship between the width, W, of the cavity 108 and the wavelength λ of light resonating within the cavity is given by the resonance condition:

$$W = \frac{m\lambda}{2}$$

where m is a positive integer. Therefore, the cavity 108 width W can be selected to support resonance of light of a particular wavelength, or light of a particular wavelength can be selected to resonate with the cavity 108. The cavity 108 can alternatively be called a "Fabry-Perot resonant cavity" or just a "resonant cavity." When the width W of the cavity 108 satisfies the resonant condition, light of an appropriate wavelength resonates within the cavity 108, bouncing back and forth between the walls for a period of time before leaking out or being absorbed by active segments of the nanowires described below with reference to FIGS. 3-4. Embodiments regarding the kinds of reflective members 102 and 104 that can be used in the device 100 and other nanowire-based devices are described in greater detail below with reference to FIGS. 6-11.

Figure 2A:
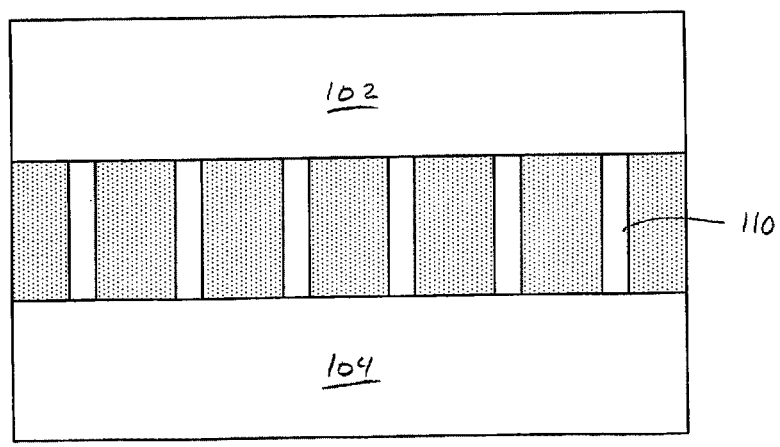
FIGS. 2A-2D show top views of four ways in which nanowires can be disposed within a cavity of the nanowire-based device, shown in FIG. 1, in accordance with embodiments of the present invention.
Figure 2B:
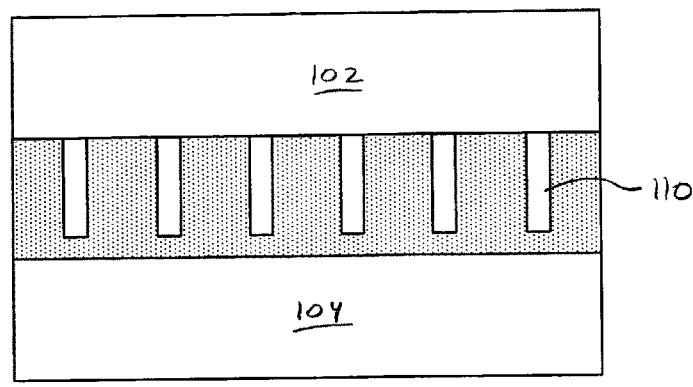
Figure 2C:
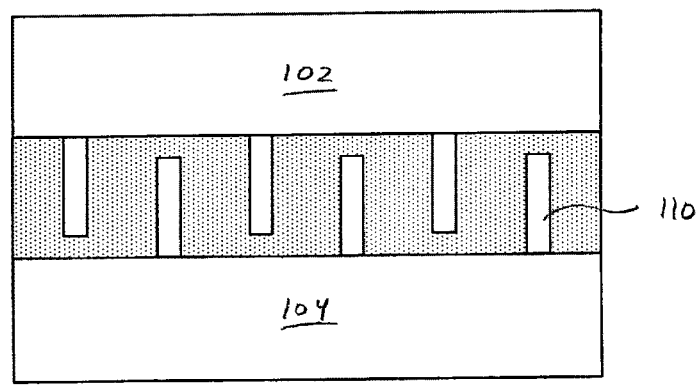
Figure 2D:
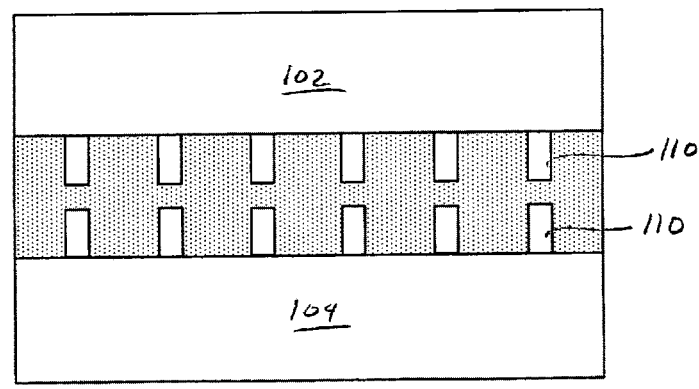

FIGS. 2A-2D show top views of the device 100 and represent just four of many ways in which the nanowires can be disposed within the cavity 108 in accordance with embodiments of the present invention. In FIG. 2A, the nanowires disposed within the cavity 108 span the entire distance between the reflective members 102 and 104. For example, the nanowire 110 is connected at both ends to the reflective members 102 and 104. In FIG. 2B, the nanowires disposed within the cavity 108 extend from reflective member 102 and do not reach the reflective member 104 leaving a gap between the ends of the nanowires and the reflective member 104. In FIG. 2C, a first portion of the nanowires extend from the reflective member 102 leaving a gap between the ends of the first portion of nanowires and the reflective member 104, and a second portion of the nanowires extend from the reflective member 104 leaving a gap between the ends of the second portion of nanowires and the reflective member 102. In FIG. 2D, nanowires extend from both reflective members and include a gap separating the unattached ends of the nanowires. In the embodiments shown in FIGS. 2B-2D, active segments can be disposed at the end of the nanowires adjacent to the gaps.

The reflective members 102 and 104 mechanically support the nanowires and/or can allow electrical connection to be made to the nanowires. In other words, the reflective members 102 and 104 can also serve as electrodes. When electrical connections are made to the reflective members 102 and 104 such that different voltages are applied to the nanowires attached to the two reflective members, the reflective members 102 and 104 must be electrically isolated from each other. Therefore, the substrate 106 can be composed of an insulating material or the substrate 106 can include an insulating layer (not shown) located beneath or within the reflective members 102 and 104 that allows electrical isolation of the reflective members 102 and 104.

Note that the array of nanowires shown in FIGS. 1-2 appear perpendicular to the reflective members 102 and 104 and are disposed in a regular pattern. However, embodiments of the present invention are not limited to these arrangements. In practice, the nanowires can be oriented at angles other than perpendicular to the reflective members, can not be arranged in a regular pattern, and the number and arrangement of nanowires disposed within the cavity 108 can vary depending on the application.

II. Nanowires

Figure 3A:
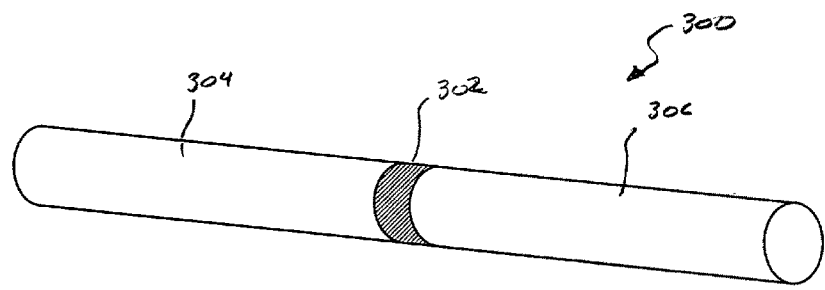
FIGS. 3A-3C show isometric views of three different longitudinal structure nanowires configured in accordance with embodiments of the present invention.
Figure 3B:
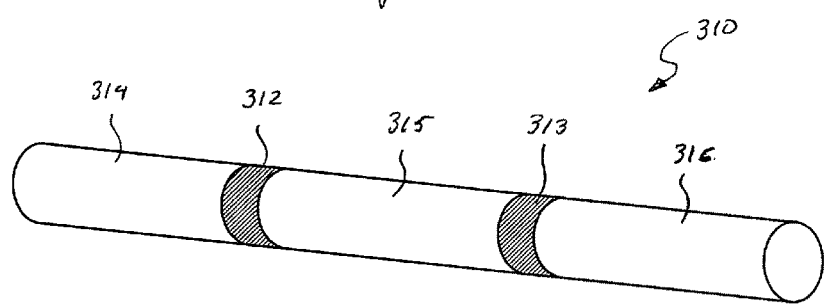
Figure 3C:
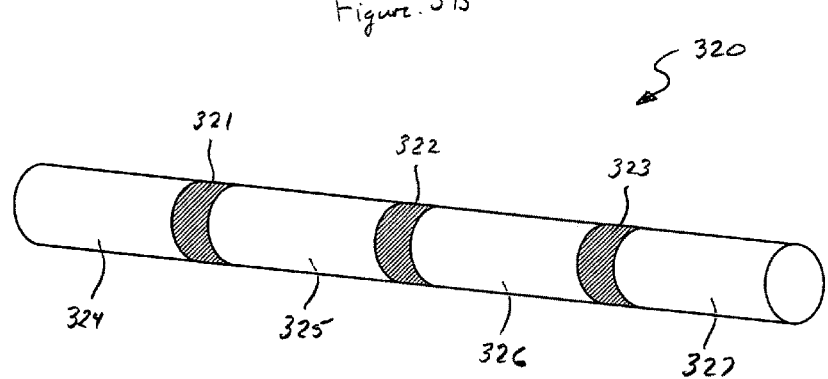

The nanowires disposed within the cavity 108 can be longitudinal structure nanowires including one or more active segments selectively disposed along the length of the nanowires. FIGS. 3A-3C show isometric views of three different longitudinal structure nanowires configured in accordance with embodiments of the present invention. In FIG. 3A, a nanowire 300 includes a single active segment 302 positioned approximately midway along the length of the nanowire and adjacent to a first segment 304 and a second segment 306. In FIG. 3B, a nanowire 310 includes a first active segment 312 and a second active segment 313. The first active segment 313 is disposed between segments 314 and 315 and the active segment 313 is disposed between segments 315 and 316. In FIG. 3C, a nanowire 320 includes three active segments 321-323. The first active segment 321 is disposed between segments 324 and 325, the second active segment 322 is disposed between segments 325 and 326, and the third active segment 323 is disposed between segments 326 and 327. Embodiments of the present invention are not limited to disposing up to three active segments along the length of a nanowire. In other embodiments, the number of active segments disposed along the length of a nanowire can vary depending on the application.

The materials used to fabricate the nanowires can vary depending on the application of the nanowire-based device and the wavelength of light selected to interact with the active segments as described below with reference to FIGS. 12-21. The non-active segments of the nanowires can be composed of doped semiconductor materials wherein the dopant concentrations can be different in different non-active segments or can vary along the length of the non-active segments. For example, the first segment 304 can be composed of a single uniformly doped p-type semiconductor material or it can be composed of a subsegment near the reflective member that is doped with a p-type dopant and a subsegment to which little or no dopant is intentionally added near the active segment 302. The second segment 306 can be composed of a single uniformly doped n-type semiconductor material or it can be composed of a subsegment near the other reflective member that is doped with an n-type dopant and a subsegment to which little or no dopant is intentionally added near the active segment 302.

Figure 4A:
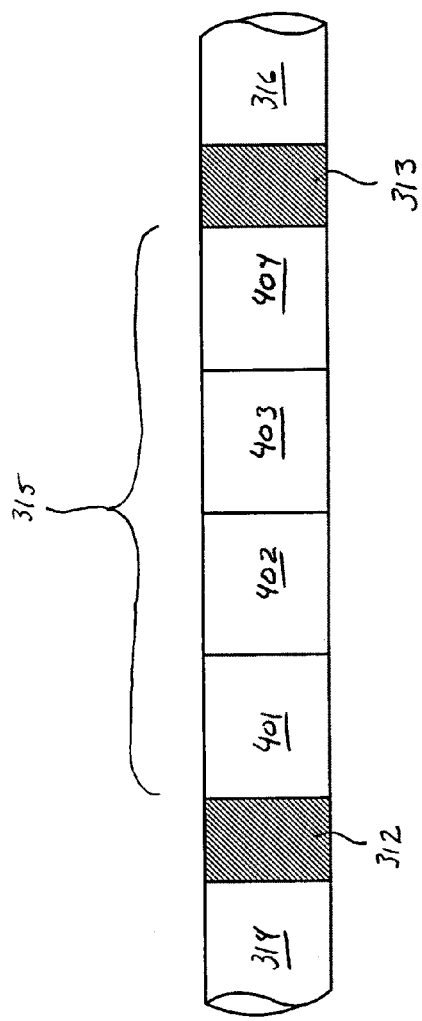
FIGS. 4A-4B identify subsegments of the nanowires shown in FIG. 3 whose compositions can be varied in accordance with embodiments of the present invention.

In certain embodiments of the nanowire 310, the dopant concentrations along the middle segment 315 can vary. FIG. 4A shows with reference to Table 1 one of many embodiments for varying impurity concentrations of the middle segment 315:

TABLE 1

| Reference # | Composition |
| --- | --- |
| 314 | n-type |
| 312 | active segment |
| 401 | p-type |
| 402 | p$^+$-type |
| 403 | n$^+$-type |
| 404 | n-type |
| 313 | active segment |
| 316 | p-type |

In various embodiments of the nanowire 310, the active segments 312 and 313 can have nearly identical dimensions and have nearly identical chemical compositions so that the active segments 312 and 313 respond in nearly the same manner to the same stimulus. In other embodiments, the active segments 312 and 313 can have different dimensions and/or different chemical compositions so that the active segments 312 and 313 each respond differently to different stimuli.

Figure 4B:
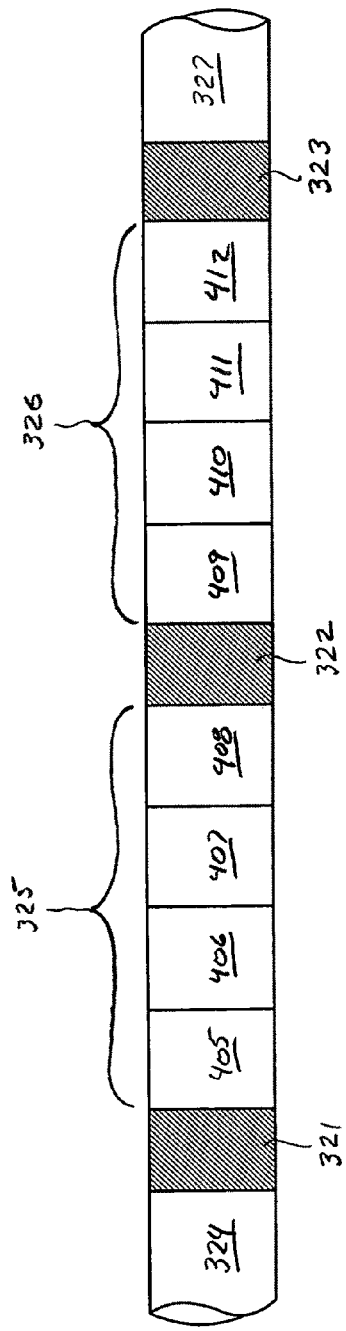

In certain embodiments of the nanowire 320, the dopant concentrations along the segments 325 and 326 can vary. FIG. 4B shows with reference to Table 2 one of many embodiments for varying the dopant concentrations of the segments 325 and 326.

TABLE 2

| Reference # | Composition |
| --- | --- |
| 324 | n-type |
| 321 | active segment |
| 405 | p-type |
| 406 | p$^+$-type |
| 407 | n$^+$-type |
| 408 | n-type |
| 322 | active segment |
| 409 | p-type |
| 410 | p$^+$-type |
| 411 | n$^+$-type |
| 412 | n-type |

TABLE 2-continued

| Reference # | Composition |
| --- | --- |
| 323 | active segment |
| 327 | p-type |

In certain embodiments, the active segments 321-323 can have nearly identical sizes and nearly identical chemical compositions. In other embodiments, the active segments 321-323 can each have different dimensions and the same or different chemical compositions such that the active segments 321-323 each respond differently to different stimuli. In still other embodiments, the outside active segments 321 and 323 can be fabricated with nearly identical dimensions and nearly identical chemical compositions while the active segment 322 can be of a different dimension and of a different chemical composition. As a result, the outside active segments 321 and 323 can respond to one stimulus while the inside active segment 322 can respond to a different stimulus.

Embodiments of the present invention are not limited to nanowires having up to three active segments selectively disposed along the length of the nanowires. In other embodiments, the number and composition of the active segments can vary depending on the particular application of the nanowire-based device. For example, in some embodiments, the nanowires can be configured with as many four, five, and six or more active segments selectively disposed along the length of the nanowires. In certain embodiments, the active segments can have nearly the same length and radial dimensions, while, in other embodiments, the dimensions and chemical compositions of the active segments can be of different.

Embodiments of the present invention include selecting the wavelength λ of light, width W of the cavity, and positions and compositions of the active segments disposed along the nanowires to substantially maximize interactions between the active segments and light resonating within the cavity 108. This is accomplished by disposing the active segments along the nanowires to substantially coincide with the position of the highest amplitude portions of standing electric and magnetic field components of the light resonating in the cavity 108.

FIGS. 5A-5C show cross-sectional views of the nanowires 300, 310, and 320 configured to substantially coincide with regions where the amplitude of the electric field components of light resonating with the cavity 108 are largest in accordance with embodiments of the present invention. The standing electric field components are directed substantially perpendicular to the central axes of the nanowires 300, 310, and 320 which correspond to the z-coordinate axes 501-503. Curves 504-506 represent the wave form of the standing transverse electric field components, and each curve corresponds to a different wavelength of light that can resonate within the cavity 108. Points where the curves 504-506 cross the axes 501-503 are called "nodes," and points half-way between the nodes along the z-coordinate axes 501-503 where the amplitude of the standing transverse electric field is largest are called "antinodes."

In FIG. 5A, the curve 504 corresponds to the wave form of a standing transverse electric field component of light resonating within the cavity 108 and having a wavelength of approximately 2W (i.e., λ≈2W). The electric field has no nodes away from the ends of the nanowire and has a single antinode 508. In order to achieve the greatest interaction between the light resonating within the cavity 108 and the active segment 302, the active segment 302 is disposed approximately in the middle of the nanowire 300 to substantially coincide with the position of the antinode 508.

In FIG. 5B, the curve 505 corresponds to the wave form of a standing transverse electric field component of light resonating within the cavity 108 and having a wavelength of approximately W (i.e., λ≈W). The electric field has one node 510 along the length of the nanowire away from the nanowire ends and two antinodes 511 and 512. In order to achieve the greatest interaction between the light resonating within the cavity 108, the active segments 312 and 313 are disposed along the nanowire 310 to substantially coincide with the positions of the antinodes 511 and 512.

In FIG. 5C, the curve 506 corresponds to the wave form of a standing, transverse electric field component of light resonating within the cavity 108 and having a wavelength of approximately 2W/3 (i.e., λ≈2W/3). The electric field has two nodes 514 and 515 along the length of the nanowire away from the nanowire ends and three antinodes 516-518. In order to achieve the greatest interaction between the light resonating within the cavity 108, the active segments 321-323 are disposed along the nanowire 320 to substantially coincide with the positions of the antinodes 516-518.

The reflective members 102 and 104 and nanowires can be composed of various combinations of indirect bandgap elemental semiconductors and direct and indirect bandgap compound semiconductors depending on how the nanowire devices are employed. Indirect elemental semiconductors include silicon ("Si") and germanium ("Ge"), and compound semiconductors are typically III-V materials, where Roman numerals III and V represent elements in the IIIa and Va columns of the Periodic Table of the Elements. Compound semiconductors can be composed of column IIIa elements, such as Aluminum ("Al"), Gallium ("Ga"), and Indium ("In"), in combination with column Va elements, such as Nitrogen ("N"), Phosphorus ("P"), Arsenic ("As"), and Antimony ("Sb"). Compound semiconductors can be classified according the relative quantities of III and V elements. For example, binary semiconductor compounds include GaAs, InP, InAs, and GaP; ternary compound semiconductors include $GaAs_yP_{1-y}$, where y ranges between 0 and 1; and quaternary compound semiconductors include $In_xGa_{1-x}As_yP_{1-y}$, where both x and y independently range between 0 and 1. Other types of suitable compound semiconductors include II-VI materials, where II and VI represent elements in the IIb and VIa columns of the periodic table. For example, CdSe, ZnSe, ZnS, and ZnO are examples of binary II-VI compound semiconductors. The insulating substrate 106 can be composed of $SiO_2$, $Si_3N_4$, or another suitable insulating material.

III. Types of Reflective Members and Other Nanowire-Based Devices

Figure 6:
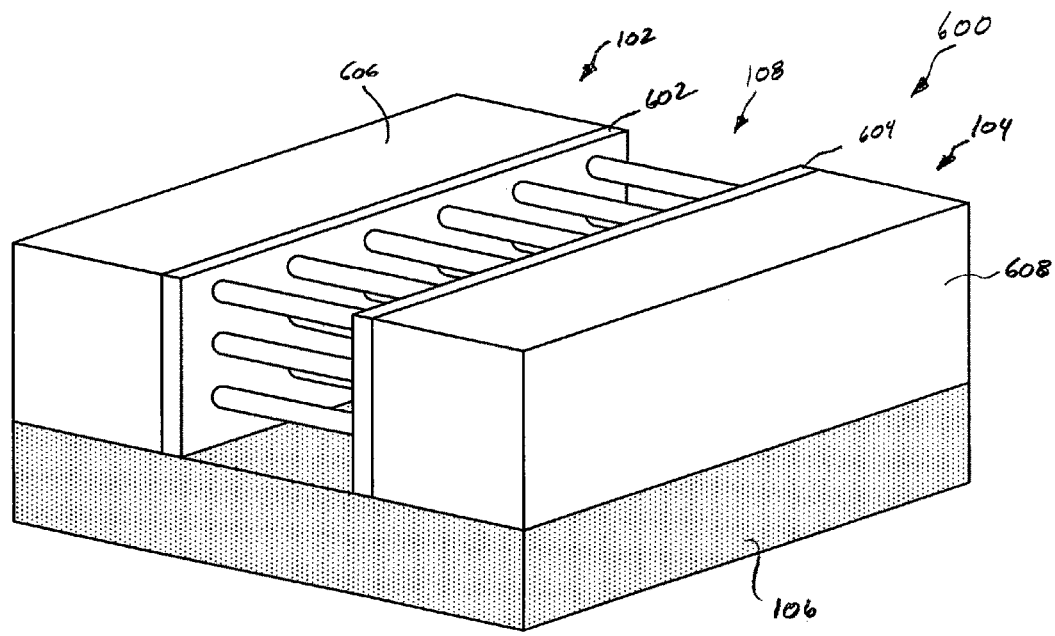
FIG. 6 shows an isometric view of a first nanowire-based device configured in accordance with embodiments of the present invention.

The reflective members 102 and 104 can be composed of semiconductor materials that provide support for the nanowires and have additional reflective surfaces lining the cavity 108. FIG. 6 shows an isometric view of a first nanowire-based device 600 configured in accordance with embodiments of the present invention. The reflective members 102 and 104 are lined with substantially planar reflective surfaces 602 and 604 that are oriented substantially parallel to each other and form the reflective surfaces of the cavity 108. The reflective surfaces 602 and 604 can be composed of materials with reflectivities greater than zero with respect to the selected wavelength of light entering the cavity 108. One or both of the reflective surfaces 602 and 604 can have a reflectivity of approximately 100% with respect to the selected wavelength of the light. Alternatively, one of the reflected surfaces, such as surface 602, can be selected to have a reflectivity of approximately 100% with respect to the selected wavelength of the light, while the other reflective surface 408 can be selected to have a reflectively of less than 100% with respect to the selected wavelength of the light. In other embodiments, both reflective surfaces can have reflectivity less than 100%. The amount of reflectivity of the reflective surfaces 602 and 604 can be selected by varying the thickness and composition of the reflective surfaces 602 and 604. For example, the reflective surface 602 can have a thickness ranging from about 30 nm to about 50 nm and have a reflectivity of about 100% with respect to the selected wavelength, and the reflective surface 604 can have a thickness of about 5 nm to about 50 nm and have less than 100% reflectivity with respect to the selected wavelength. In this configuration, light of the selected wavelength resonates within the cavity 108 between the reflective surfaces 602 and 604 and at least a portion of the light leaks out through the partially reflective surface 604. The material composing the reflective members 102 and 104 can also be selected so that the walls 602 and 604 have a reflectivity greater than zero with respect to the selected wavelength of the light.

Figure 7:
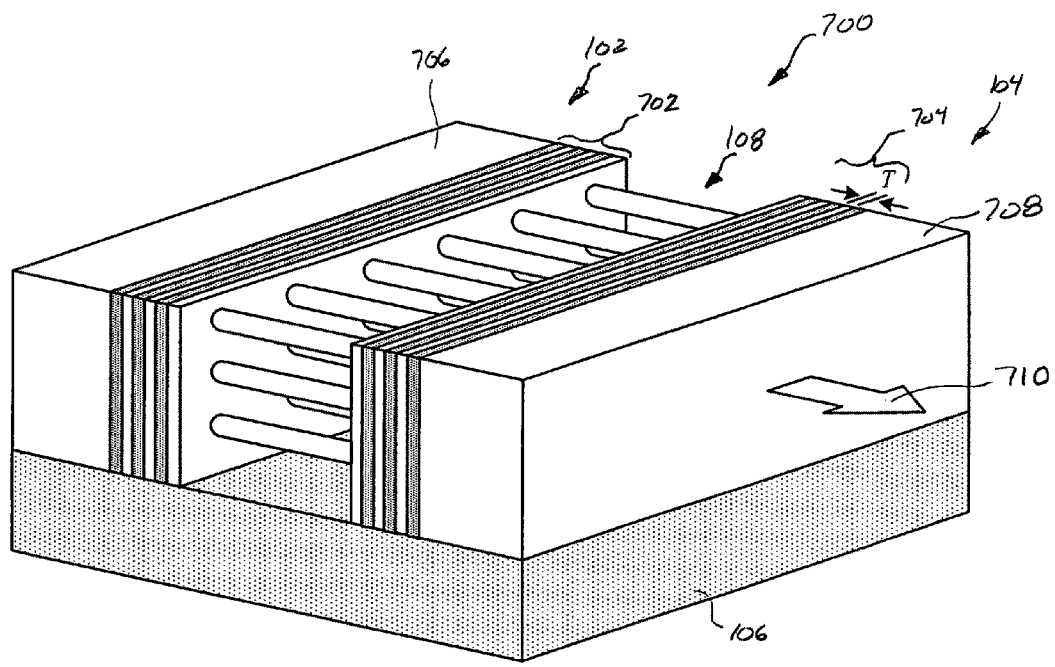
FIG. 7 shows an isometric view of a second nanowire-based device configured in accordance with embodiments of the present invention.

In other embodiments, the reflective members 102 and 104 can include Bragg-mirrors. FIG. 7 shows an isometric view of a nanowire-based device 700 configured in accordance with embodiments of the present invention. The reflective members 102 and 104 of the device 700 include Bragg-mirrors 702 and 704 that are also called "one-dimensional photonic crystals." Bragg mirrors are photonic devices including alternating layers of low refractive index and relatively higher refractive index semiconductor materials. For example, unshaded layers can be composed of semiconductor materials having a relatively higher refractive index than shaded layers. In particular, the shaded layers can be air or unfilled space between the higher effective refractive index unshaded layers, or the shaded layers can be composed of AlGaAs separating the higher effective refractive index unshaded layers composed of GaAs.

Figure 8:
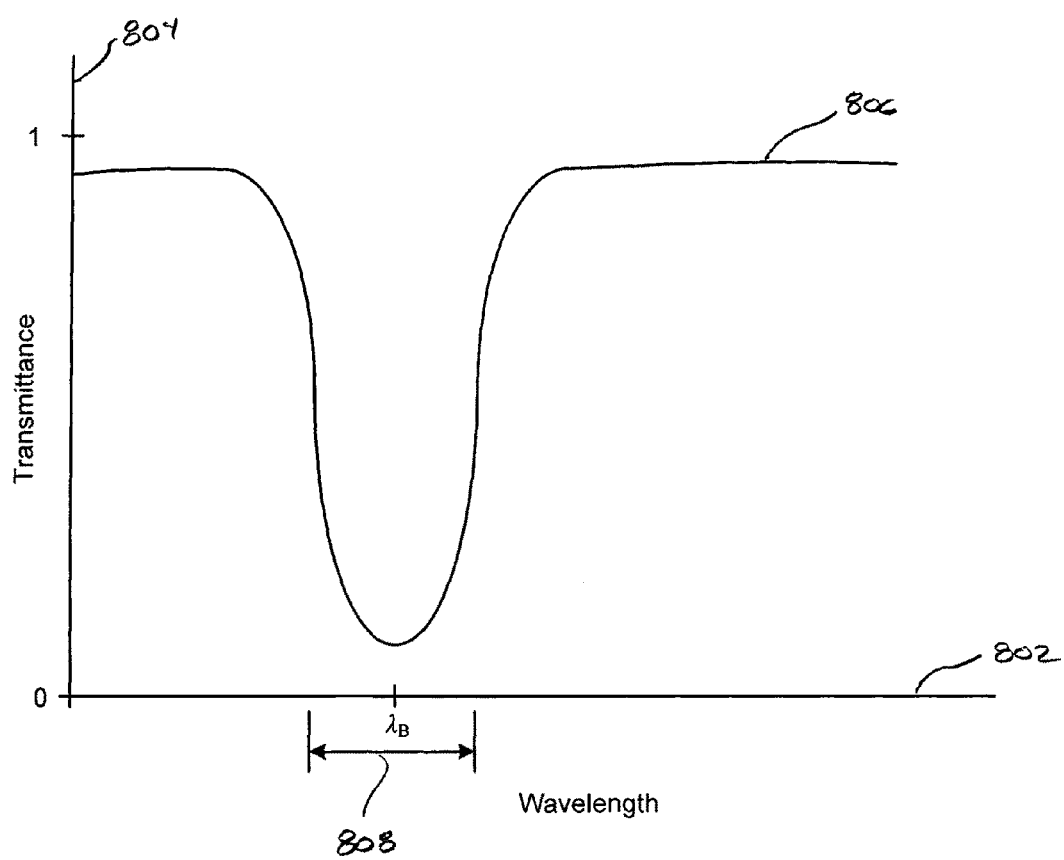
FIG. 8 shows an exemplary plot of a transmittance curve associated with Bragg mirrors.

The thickness of the layers forming the Bragg mirrors 702 and 704 can be selected to reflect light with particular wavelengths and transmit light with other wavelengths. This can be accomplished by selecting the thickness of the layers in accordance with:

$$T = \frac{\lambda_B}{4n_{\mathit{eff}}}$$

where $\lambda_B$ is the selected, predetermined wavelength called the "Bragg wavelength," and $n_{\mathit{eff}}$ is the effective refractive index of the layers. The Bragg mirrors 702 and 704 are configured to operate as filters that substantially reflect light over a range of wavelengths centered about the Bragg wavelength $\lambda_B$. FIG. 8 shows an exemplary plot of a transmittance curve associated with the Bragg mirrors 702 and 704 in accordance with embodiments of the present invention. A horizontal axis 802 represents a range of wavelengths associated with light incident perpendicular to the layers of the Bragg mirrors 702 and 704, a vertical axis 804 represents transmittance, and a curve 806 displays the transmittance mathematically represented by:

$$\text{Transmittance} = \frac{I_{out}}{I_{in}}$$

where $I_{in}$ represents the intensity of the incident light, and $I_{out}$ represents the intensity of the light transmitted through one or more of the Bragg mirrors 702 and 704 and one or more of the support structures 706 and 708 substantially perpendicular to the layers as represented by directional arrow 710 FIG. 8 reveals that light incident substantially perpendicular to the layers and having wavelengths in a neighborhood 808 of the Bragg wavelength $\lambda_B$ corresponding to an energy called the "photonic bandgap" is substantially reflected, and light with wavelengths corresponding to energies outside of the photonic bandgap 808 is substantially transmitted through the Bragg mirrors 702 and 704. In other words, the output intensity $I_{out}$ associated with incident light having wavelengths in the photonic bandgap 808 is ideally nearly "0," and the output intensity $I_{out}$ associated with incident light having wavelengths outside the photonic bandgap 808 is ideally nearly equal to the input intensity $I_{in}$. FIG. 8 also reveals that the Bragg mirrors 702 and 704 can be less than 100% effective at preventing light within the photonic bandgap 808 from leaking into or out of the cavity 108. The amount light reflected depends on the contrast between the refractive indices of the materials composing the layers.

In other embodiments, two-dimensional photonic crystals can be used to form the reflective members 102 and 104 and create a cavity 108. Two-dimensional photonic crystals are photonic devices composed of two or more different materials that, when combined together in a regular pattern, can modify the propagation characteristics of light. The references *Fundamentals of Optical Waveguides*, by Katsunari Okamoto, Elsevier Inc. 2005; *Optical Waveguide Theory*, by Snyder and Love, Chapman and Hall, London, 1983; and *Photonic Crystals*, by Jean-Michel Lourtioz, Springer-Verlag, Berlin, 2005 are just of few of many references describing in detail photonic crystals.

Figure 9A:
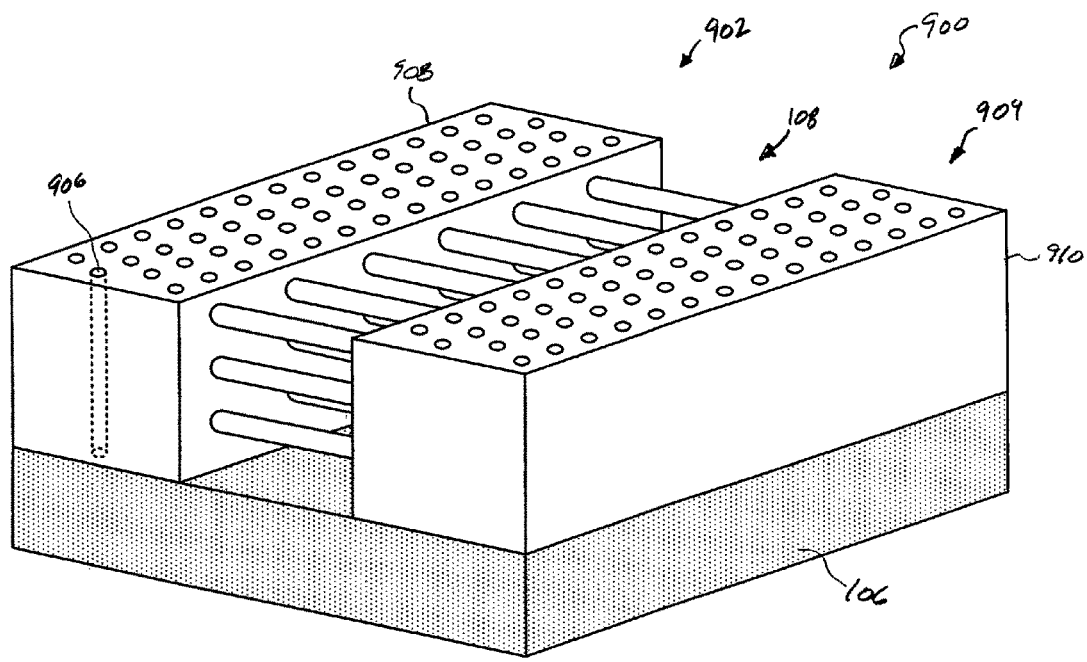
FIGS. 9A-9B show isometric and top views of a third nanowire-based device configured in accordance with embodiments of the present invention.
Figure 9B:
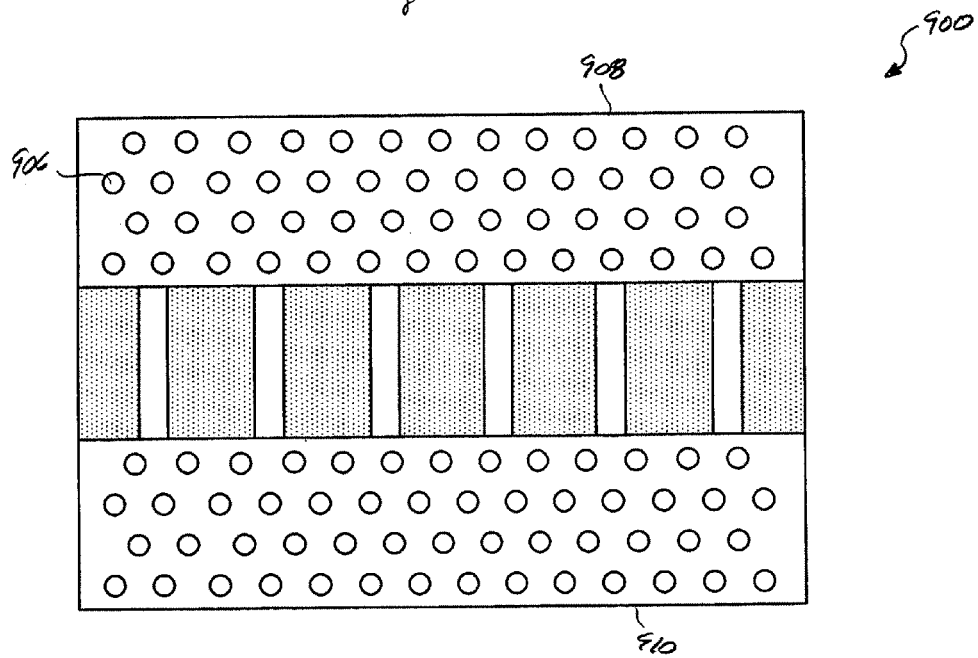

FIGS. 9A-9B show isometric and top views of a third nanowire device 900 configured in accordance with embodiments of the present invention. The photonic crystals 902 and 904 include a lattice of cylindrical holes, such as cylindrical hole 906, fabricated in slabs 908 and 910. The slabs 908 and 910 can be semiconductor materials and the cylindrical holes can be air holes or holes filled with a dielectric or semiconductor material having a refractive index that is different from the slabs 908 and 910. The cylindrical hole dimensions, arrangement, lattice spacing, and the materials comprising the slabs 908 and 910 and the holes can be pre-selected to create a photonic bandgap that substantially reflects the selected wavelength of the light and allows the light to resonate within the cavity 108.

Figure 10A:
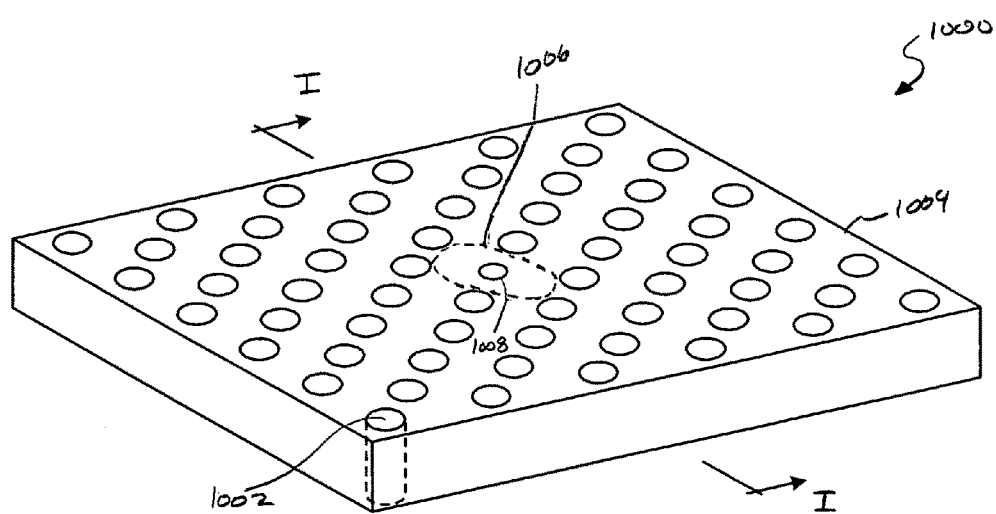
FIG. 10A shows an isometric view of a fourth nanowire-based device configured in accordance with embodiments of the present invention.

FIG. 10A shows an isometric view of a fourth nanowire device 1000 configured in accordance with embodiments of the present invention. The device 1000 is a two-dimensional photonic crystal having a lattice of cylindrical holes, such as cylindrical hole 1002, fabricated in a single slab 1004. The slab 1004 can be a semiconductor material supported by an insulating substrate (not shown) and the cylindrical holes can be air holes or holes filled with a dielectric or semiconductor material having a refractive index that is different from the slab 1004. The device 1000 includes a resonant cavity identified by dashed-line circle 1006 created by forming a hole 1008 with a diameter that is different from the diameter of the holes in the surrounding photonic crystal 1000. The dimensions of the hole 1008 can be pre-selected so the cavity 1006 can support resonance of the selected wavelength of light. For example, the hole 1008 of the resonant cavity 1006 is smaller than the diameter of the surrounding holes. Nanowires can be formed in the hole 1008 and fabricated with active segments that interact with light of the selected wavelength supported by the resonant cavity 1006.

Figure 10B:
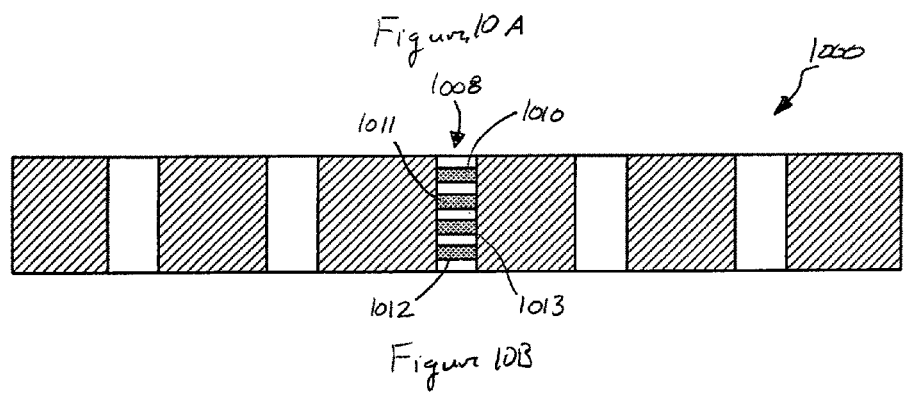
FIG. 10B-10C shows two different cross-sectional views along a line I-I, shown in FIG. 10A, in accordance with embodiments of the present invention.
Figure 10C:
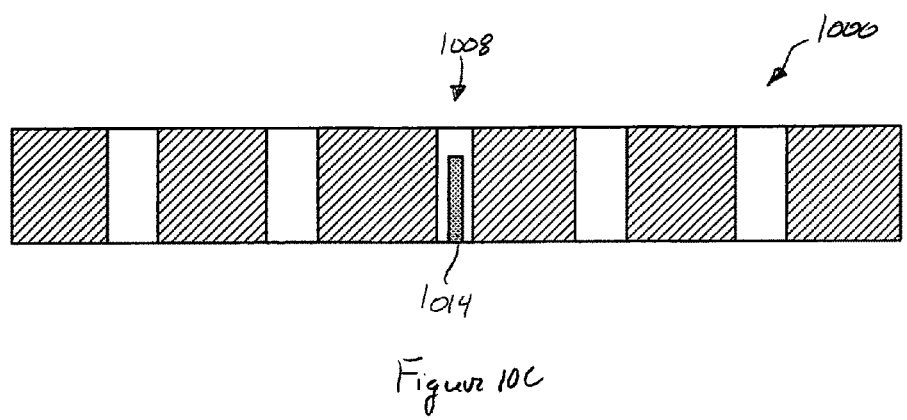

In certain embodiments, the nanowires can be disposed substantially perpendicular to the central axis of the hole. In other embodiments, the nanowires can be disposed on the substrate (not shown) and extend substantially parallel to the central axis of the hole 1008. FIG. 10B-10C shows two different cross-sectional views along the line I-I, shown in FIG. 10A, in accordance with embodiments of the present invention. In FIG. 10B, the hole 1008 includes four nanowires 1010-1013 disposed substantially perpendicular to the central axis the hole 1008. In FIG. 10C, the hole 1008 includes a single nanowire 1014 disposed substantially parallel to the axis of the hole 1008.

Figure 11:
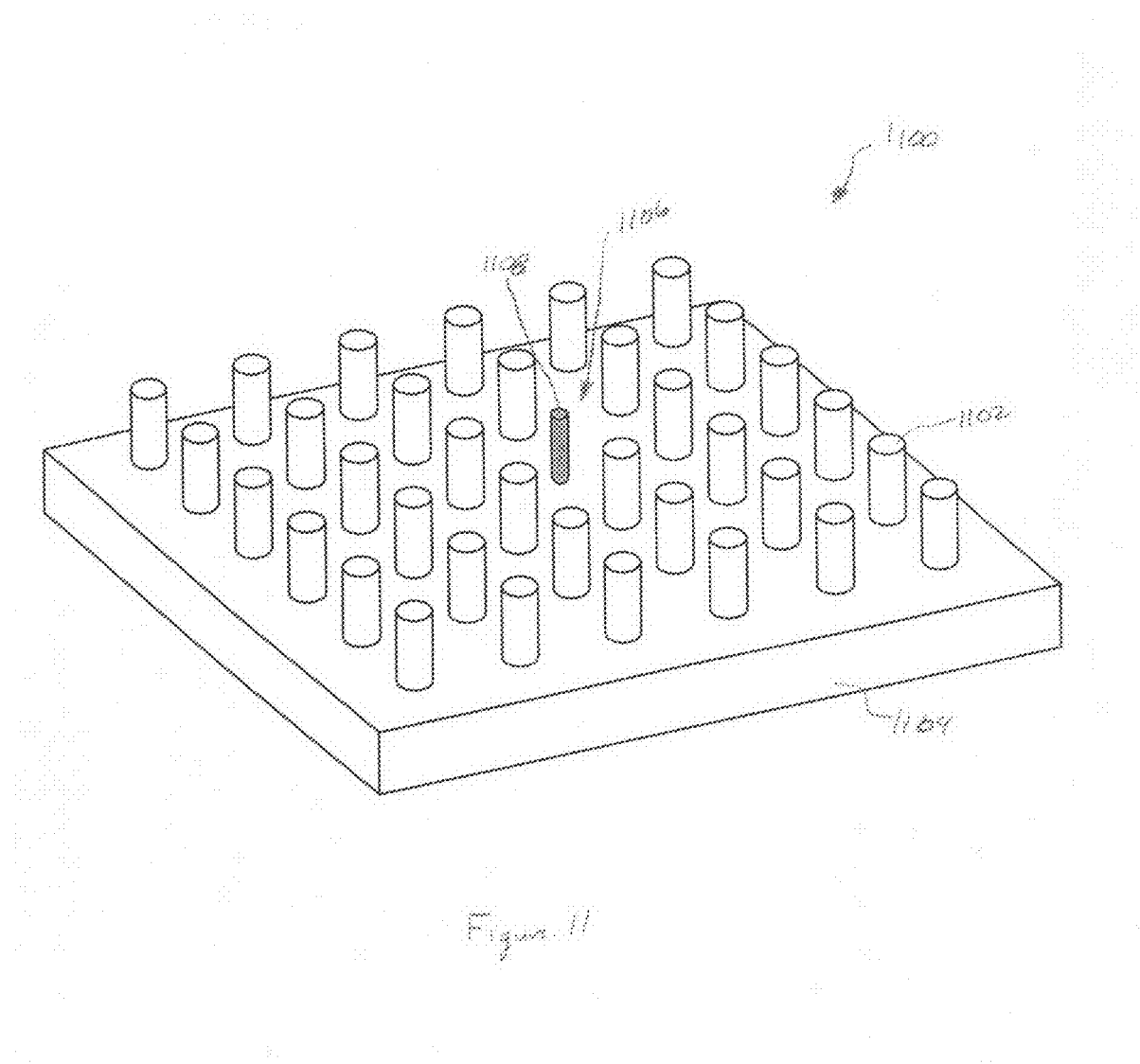
FIG. 11 shows an isometric view of a fifth nanowire-based device configured in accordance with embodiments of the present invention.

FIG. 11 shows an isometric view of a fifth nanowire device 1100 configured in accordance with embodiments of the present invention. The device 1100 is a two-dimensional photonic crystal having a lattice of cylindrical columns, such as column 1102, disposed on an insulating substrate 1104. The device 1100 includes a resonant cavity 1106 created by removing a column from the lattice of columns. A nanowire 1108 is placed in the cavity 1106 extending substantially vertical from the surface of the substrate 1104. The dimensions and materials of the cylinders forming the resonant cavity 1106 can be pre-selected to support resonance of the selected wavelength of light interacting with active segments of the nanowire 1108.

The nanowire-based devices described above can be employed in various modulator, chemical sensor, and light-detection device embodiments of the present invention. However, in the interest of brevity and for the sake of simplicity, the general nanowire-based device 100 is used in the following description of these embodiments. Those skilled in the art will immediately recognize that the particular nanowire-based devices described above with reference to FIGS. 6-11 can be substituted for the device 100 in the following description. Note that although the nanowire-based devices described below all include nanowires that span the cavity as described above with reference to FIG. 2A, embodiments of the present invention are not so limited. The nanowires of the nanowire-based devices can include gaps separating the nanowires at one end from one of the reflective members, such as the nanowires described above with reference to FIGS. 2B-2D.

IV. Nanowire-Based Modulators

Modulator embodiments include forward-bias modulators and reverse-bias modulators. Both types of modulators can be configured and operated to receive unmodulated light and modulate the unmodulated light or output modulated light of a similar wavelength.

IV.A. Forward-Bias Modulators

FIG. 12 shows a top-view and schematic representation of a forward-bias modulator 1200 configured in accordance with embodiments of the present invention. The nanowires extending between the reflective members 102 and 104 are all nearly identically configured based on the nanowire 300, shown in FIG. 3A. For example, the nanowire 1202 includes an active segment 1204 disposed approximately midway in the cavity between an n-type semiconductor segment 1206 and a p-type semiconductor segment 1208. The reflective members 102 and 104 are electronically coupled to a voltage source 1210 via wires 1212 and 1214, respectively. The voltage source 1210 applies a forward bias to the nanowires by supplying a negative voltage to the reflective member 102 and a positive voltage to the reflective member 104. The n- and p-type nanowire segments can be composed of a relatively wide (direct or indirect) electronic bandgap semiconductor material, and the active segments can be composed of a narrower, direct bandgap semiconductor material that emits light with wavelengths satisfying the resonance condition of the cavity 108.

In general, when no bias is applied to the modulator 1200, the difference in electron concentrations between the n-type segments and the p-type segments cause electrons to diffuse from the n-type segments into the active segments and a portion of the p-type segments. For each nanowire, the potential difference between the n- and p-type segments creates an electric field across the active segment. This electric field is directed from the interface between the active segment and the n-type segment to the interface between the active segment and the p-type segment. The electric field across each active segment forces electrons in the active segment to drift into the n-type segments. Ultimately, an equilibrium is reached where the number of electrons diffusing from the n-type segments into the active segments equals the number of electrons drifting from the active segments into the n-type segments.

FIG. 13A shows an electronic energy-band diagram associated with a nanowire spanning the cavity 108 with no bias applied in accordance with embodiments of the present invention. Heavily shaded valence bands represent a continuum of mostly filled electronic energy states, and lightly shaded conduction bands represent a continuum of mostly vacant electronic energy states or holes. Electron donor impurities in the n-type segment create electronic states in the forbidden energy gap near the conduction band edge while electron acceptor impurities in the p-type segment create vacant electronic energy states in the forbidden energy gap near the valence band edge, which contribute holes to the valence band. Thus, the valence and conduction bands associated with the p-type segment is higher in electronic energy than the valence and conduction bands associated with the n-type segment. Because of the high concentration of electrons near the conduction band in the n-type segment, electrons can be thermally excited into the conduction band and occupy the lower conduction band electronic energy states 1302, and the higher concentration of holes in the p-type segment occupy the highest valence band electronic energy states 1304. At zero bias, the active segments have a relatively low concentration of electrons in the conduction band and a relatively low number of holes in the valence band.

FIG. 13B shows an electronic energy-band diagram associated with a nanowire spanning the cavity 108 under an applied forward-bias in accordance with embodiments of the present invention. Under a forward bias, electrons are injected from the voltage source 1210 into the conduction band of the n-type segment, and holes are injected into the valence band of the p-type segment. In contrast to the electronic energy-band diagram shown in FIG. 13A, the electronic energy associated with the valence and conduction bands of the p-type segment are lowered relative to the valence and conduction bands of the n-type segment. The strength of the electric field across the active segment is reduced or eliminated and electrons are injected 1306 from the conduction band of the n-type segment into the conduction band of the active segment, while holes are injected 1308 from the valence band of the p-type segment into the valence band of the active segment. As a result, there is high density of electrons in the conduction band of the active segment and a corresponding high density of holes in the valence band of the active segment. The relatively higher electronic bandgap energies $E_{gn}$ and $E_{gp}$ of the n- and p-type segments, respectively, serve to confine the injected carriers to the respective bands of the active segment. As long as an appropriate voltage is applied in the same forward-bias direction, high densities of carriers are maintained in the active segment, and electrons and holes can spontaneously recombine at the active segment producing photons with wavelengths $\lambda$ satisfying the condition, $hc/\lambda \geq E_g$, where $E_g$ is the electronic bandgap of the active segment.

The forward-bias modulator 1200 can be used to modulate a beam of unmodulated light entering the cavity 108 from any input direction as follows. Photons composing incident unmodulated light satisfy the condition:

$$E_{gn} \text{ and } E_{gp} > \frac{hc}{\overline{\lambda}} \geq \frac{hc}{\lambda} \geq E_g$$

where h is Plank's constant, c is the speed of light in free space, and $\overline{\lambda}$ is the wavelength of an incident unmodulated photon. A portion of the photons composing the incident light resonate within the cavity 108. When no bias is applied to the modulator 1200, a photon of the incident unmodulated light with wavelength $\overline{\lambda}$ resonating within the cavity 108 is absorbed by an active segment. As shown in FIG. 13A, the photon excites an electron from the valence band into the conduction band of the active segment. The force of the electric field across the active segment drives the excited electron out of the modulator 1200 along the wire 1212. The electron passes through the voltage source 1210 until the electron reaches a p-type segment of a nanowire where it recombines with a hole in a non-radiative process. In general, when no voltage is applied to the modulator 1200, photons of the wavelength $\overline{\lambda}$ are absorbed by exciting electrons from the valence bands into the conduction bands of the active segments. The excited electrons are driven out of the modulator 1200 by the electric fields across the active segments and the corresponding portion of the incident light is lost. The modulator 1200 is said to be in a lossy state.

On the other hand, when the modulator 1200 is forward biased, as shown in FIG. 13B, electrons are injected from the voltage source 1210 into the conduction bands of the n-type segments, and because the electric fields across the active segments are reduced or eliminated, electrons are injected into the conduction bands of the active segments where the electrons can spontaneously recombine with holes in the valence bands of the active segments emitting photons with the wavelength $\lambda$. In addition, a portion of incident photons of wavelength $\overline{\lambda}$ resonating in the cavity 108 are absorbed causing electrons to be excited from the valence bands into the conduction bands of the active segments. Because of the reduced strength of the electric fields across the active segments, the excited electrons are not driven out of the modulator 1200 as is the case when no bias is applied. Instead, these electrons excited into the conduction bands can then spontaneously recombine with holes in the valence bands of the active segments also emitting photons with the wavelength $\lambda$. In other words, when a forward bias is applied, a portion of the incident photons with the wavelength $\overline{\lambda}$ are absorbed and light is produced with the wavelength $\lambda$. Thus, incident light appears to be transmitted through the modulator 1200, and the modulator 1200 is said to be in a transparency state.

By varying the forward bias applied to the modulator 1200 to create the lossy state and the transparency state, the modulator 1200 can be used to produce modulated light. FIG. 14 shows a plot 1402 of voltage versus time and a plot 1404 of optical power output versus time for the forward-bias modulator 1200 in accordance with embodiments of the present invention. The plots 1402 and 1404 reveal a correspondence between the magnitude of the applied forward bias and the optical power output from the modulator 1200. During the time intervals when no bias is applied, the corresponding optical power output is relatively lower than the optical power output during the time intervals when a forward bias is applied. Bit values can be assigned to the two relatively different optical power outputs. For example, the bit "1" can be assigned to the high optical power outputs, and the bit "0" can be assigned to the relatively lower optical power outputs. The forward-bias modulator 1200 can yield modulation rates of up to about 10 Gb/s.

IV.B. Reverse-Bias Modulators

FIG. 15 shows a top-view and schematic representation of a reverse-bias modulator 1500 configured in accordance with embodiments of the present invention. The modulator 1500 and nanowires can be nearly identical to the forward-bias modulator 1200 except the reflective members 102 and 104 are electronically coupled to a voltage source 1502 that applies a reverse bias to the nanowires by supplying a positive voltage to the reflective member 102 and a negative voltage to the reflective member 104. Under the reverse bias, the modulator 1500 can be operated in the Franz-Keldysh mode or using the quantum-confined Stark Effect where the absorption characteristics are changed by changing the spatial position of the electron and hole wave functions associated with the active segments. Using these phenomena, the modulator 1500 can modulate incident unmodulated light by varying the reverse-bias voltage.

The reverse-bias modulator 1500 can be used to modulate an unmodulated incident beam of light as follows. FIG. 16 shows a plot of optical power loss versus a range of wavelengths for an active segment of the reverse-bias modulator 1500 configured in accordance with embodiments of the present invention. Horizontal axis 1602 represents a range of wavelengths, vertical axis 1604 represents optical power loss, curve 1606 represents optical power loss for the active segment at zero bias, and curve 1608 represents optical power loss for the active segment under an appropriate reverse bias. The curve 1606 reveals optical power loss for light in the wavelength range 1610 when no bias is applied. In contrast, the curve 1608 reveals a relatively larger optical power loss for light in the wavelength range 1610 when an appropriate reverse bias is applied.

FIG. 17 shows a plot 1702 of voltage versus time and a plot 1704 of optical power output versus time for the reverse-bias modulator 1700 in accordance with embodiments of the present invention. The plots 1702 and 1704 reveal that during the time intervals when no bias is applied, the corresponding optical power output is relatively higher than the optical power output during the time intervals when a reverse bias is applied. Bit values can be assigned to the relatively different optical power outputs. For example, the bit "1" can be assigned to the high optical power outputs, and the bit "0" can be assigned to the relatively lower optical power outputs.

Operating the modulator 1500 as a reverse-bias modulator can yield modulation rates as high as about 40 Gb/s to about 100 Gb/s.

Modulator embodiments are not limited to modulating a single beam of unmodulated light. In other embodiments, the forward-bias modulator 1200 and the reverse-bias modulator 1500 can be configured to modulate two or more incident beams of light. This can be accomplished by configuring all of the nanowires with the same set of two or more different active segments, where the active segments are selectively disposed along the length of the nanowires as described above with reference to FIG. 3. Each active segment can be configured to absorb a particular wavelength of incident light, as described above with reference to FIGS. 12-17.

V. Nanowire-Based Chemical Sensors

In chemical sensor embodiments of the present invention, the nanowires of the nanowire-based devices can be modified to include chemical binding sites that attach specific target species in an analyte. The analyte can be a liquid or a gas and can be composed of a number of different chemical species. The target species can be a particular kind of atom or molecule within the analyte that is detected by selectively binding the target species to the binding sites. The active segments can be configured to include binding sites or other portions of the nanowire can be configured to include binding sites. The binding sites can be a semiconductor or a metal, depending on the mechanism being used to detect the presence of the target species. After an analyte is introduced to the chemical sensor, the target species attaches to the binding sites which changes the optical properties of the active segment or changes the optical properties of the region of the nanowire where the target species is attached. When the target species attaches to the binding site and the binding site is disposed along the nanowire to substantially coincide with an antinode of light resonating in the cavity 108, that maximum change in the optical properties of the target species/binding site complex can be observed.

Figure 18A:
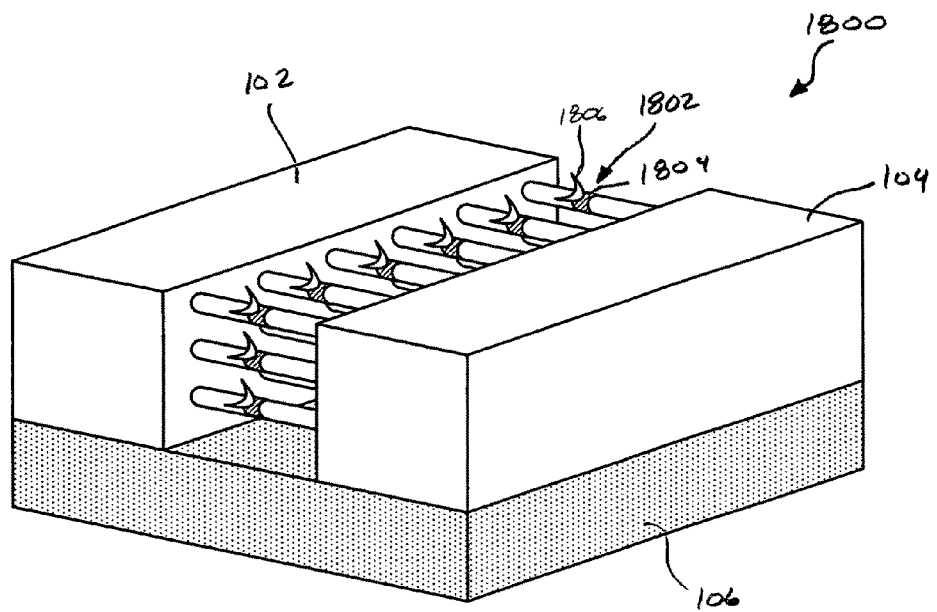
FIG. 18A shows a chemical sensor configured in accordance with embodiments of the present invention.
Figure 18B:
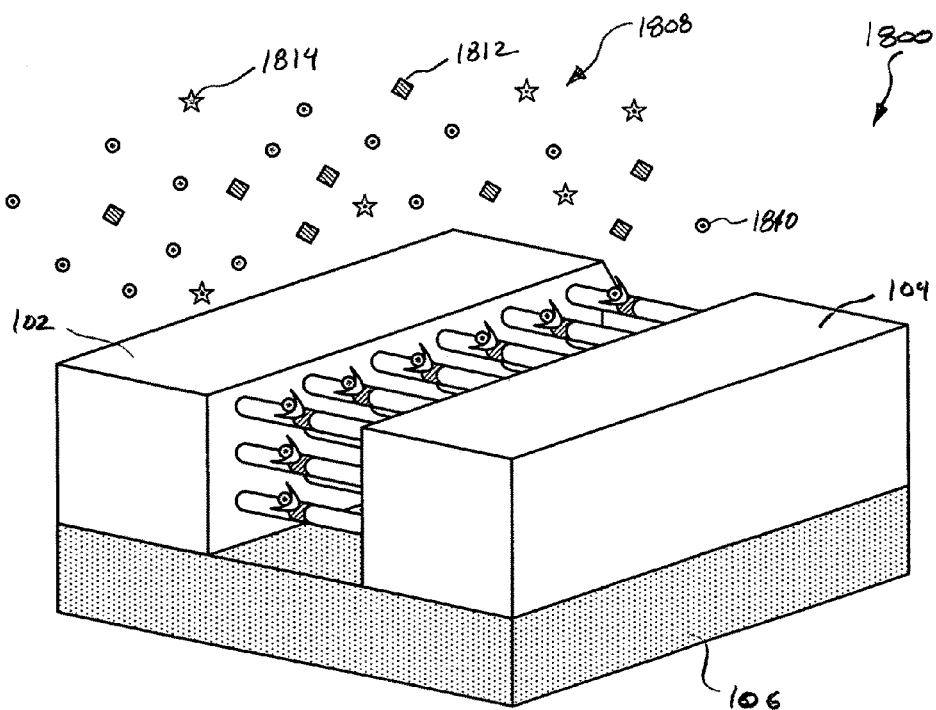
FIG. 18B shows the chemical sensor, shown in FIG. 18A, exposed to an analyte in accordance with embodiments of the present invention.

FIG. 18A shows a chemical sensor 1800 configured to detect a single target species of an analyte in accordance with embodiments of the present invention. Each of the nanowires extending between the reflective members 102 and 104 includes a single active segment configured as described above with reference to the nanowire 300 shown in FIG. 3. Each active segment is configured to include one region with binding sites. In practice, within the region there can be many individual molecular scale binding sites to which a target species can attach. The binding sites are pre-designed to attach a particular target species in an analyte. For example, the nanowire 1802 includes an active segment 1804 that includes binding sites 1806. In other embodiments, the binding sites can be disposed on or adjacent to the active segment, or the binding sites can also be disposed at other locations along the nanowires. FIG. 18B shows the chemical sensor 1800 exposed to an analyte 1808 in accordance with embodiments of the present invention. In the analyte 1808, the target species is represented by shaded circles 1810 and the remaining chemical species of the analyte 1808 are represented by shaded diamonds 1812 and stars 1814. As shown in FIG. 18B, after exposing the chemical sensor 1800 to the analyte 1808 for a period of time, the target species binds to the binding sites.

Depending on the chemical compositions of the target species and the binding sites, the binding can be covalent bonding, ionic bonding, metallic bonding, hydrogen bonding, or the binding can be due to van der Waals forces, molecular-ion attachment, or other forces that characterize attaching the target species to the binding sites. Once a target species is attached to a binding site, the chemical composition of the binding site can change, which can lead to a change in the optical properties of the active segment to which it is attached or to the region of the nanowire to which it is attached.

In certain chemical sensor embodiments, applying an appropriate stimulus, such as an appropriate voltage or optical stimulus, to the chemical sensor 1800 produces a particular emission spectrum that changes from the emission spectrum when a target species is not attached to the binding sites. These changes can be sensed optically by illuminating the region of the binding sites with light of one wavelength and observing the emitting radiation at other wavelengths corresponding to the target species attached to the binding sites, such as in Raman spectroscopy. Alternatively, the surface structure of the active segments can greatly enhance the light emitted from the target species attached to the binding sites of the active segment, such as in surface-enhanced Raman spectroscopy ("SERS").

Figure 19A:
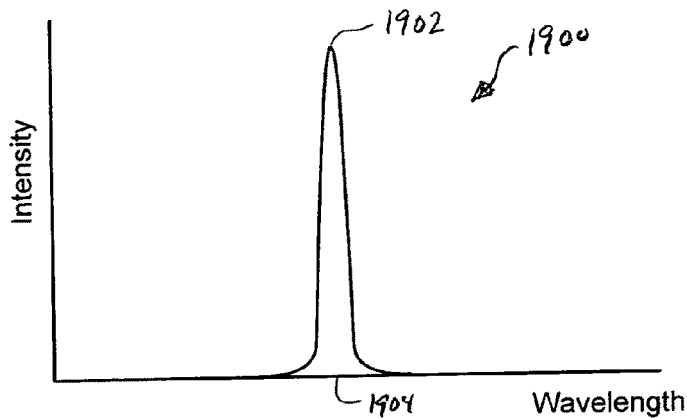
FIGS. 19A-19C show intensity versus wavelength emission spectra associated with a chemical sensor in accordance with embodiments of the present invention.
Figure 19B:
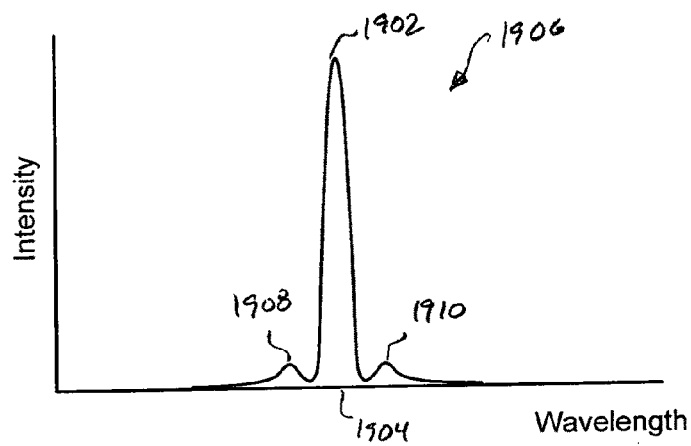
Figure 19C:
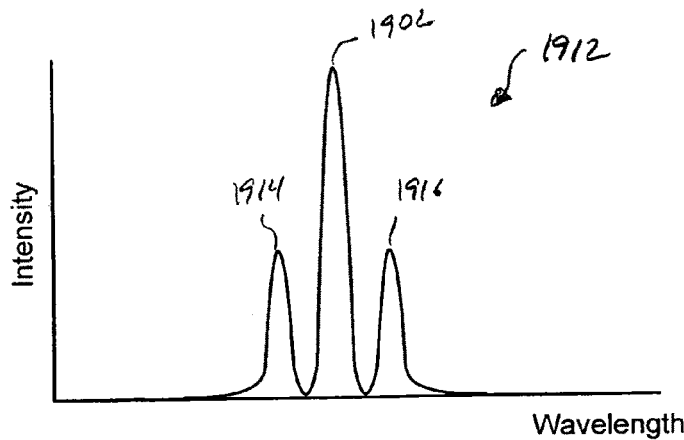

The size of the cavity 108 can be selected so that the wavelength emitted by the target species or the target species/binding site/active segment complex is resonant in the cavity 108. The binding sites can be disposed along the nanowires during fabrication to substantially coincide with the antinodes of the light resonating in the cavity 108 in order to increase the sensitivity and efficiency of the chemical sensor 1800. FIGS. 19A-19C show intensity versus wavelength emission spectra associated with disposing the binding sites away from the active segments or disposing the binding sites at the active segments, where the active segments are disposed along the nanowires to coincide with light resonating in the cavity 108. FIG. 19A shows an emission spectrum 1900 associated with the chemical sensor 1800 when the active segments are illuminated with light of a particular wavelength and no target species is attached to the binding sites. The emission spectrum 1900 reveals a single peak 1902 centered about a wavelength of light 1904 emitted from the active segments. FIG. 19B shows an emission spectrum 1906 associated with the chemical sensor 1800 when the target species attaches to binding sites disposed along the nanowire surface away from the active segments. The emission spectrum 1906 reveals the peak 1902 associated with the active segments and two considerably smaller peaks 1908 and 1910 associated with the target species attached to the binding sites away from the active segments. FIG. 19C shows an emission spectrum 1912 associated with the chemical sensor 1800 when the target species attaches to the binding sites disposed on the active segments which are positioned at the antinodes of the optical cavity 108. The emission spectrum 1912 reveals significantly larger peaks 1914 and 1916 associated with the target species than the relatively smaller peaks 1908 and 1910 because the target species are positioned at the antinodes of the light resonating in the cavity 108.

In other chemical sensor embodiments, the target species can undergo a chemical reaction with the binding sites that changes the electronic band structure of the binding sites and thereby changes the emission spectrum of the chemical sensor 1800. The active segments on which the binding sites are located can be disposed along the length of the nanowires to substantially coincide with one or more antinodes of the cavity in order to increase the sensitivity of the chemical sensor 1800. When a target species is attached to the binding sites at the active segments, the emission spectrum of the chemical sensor 1800 can be shifted or the intensity of the light emitted can increase or decrease by comparison with the emission spectrum observed when the target species is not present, or the pump power needed to generate the emission can change.

In other chemical sensor embodiments, the chemical sensor 1800 can be used to detect a target species in an analyte by operating the chemical sensor 1800 as a photodiode. The chemical sensor 1800 can be configured with nanowires having p-n or p-i-n junction active segments, as described above with reference to FIGS. 3-4. The active segments of the nanowire can be disposed along the nanowires to substantially coincide with the antinodes of light resonating in the cavity 108 in order to substantially maximize the amount of photocurrent generated. The active segments include binding sites that attach to a target species in an analyte. There are two kinds of embodiments in which the chemical sensor 1800 can be configured and used as a photodiode to detect the presence of a target species.

In a first embodiment, a target species can be detected by observing a measurable decrease in the photocurrent produced by the chemical sensor 1800. The composition of the active segments and binding sites and the wavelength of the light resonating in the cavity can be selected so that when no target species is attached to the binding sites of the active segments, the light resonating in the cavity 108 is absorbed by the active segments. In particular, the photons of the light resonating in the cavity 108 have energies satisfying the condition:

$$\frac{hc}{\lambda} \geq E_g$$

where $\lambda$ is the wavelength of the photon, and $E_g$ is electronic bandgap energy of the active segments without an attached target species. The photons are absorbed by exciting electrons from the valence band into the conduction band of the active segments creating electron-hole pairs. The force of the electric field across the active segments creates a measurable photocurrent. On the other hand, when a target species of an analyte attaches to the binding sites of the active segments, the active segments can be configured to undergo a chemical reaction that changes the electronic band structure of the active segments. As a result, when a target species attaches to the binding sites of the active segments, the electronic band structure of the active segment is changed so that the energy of the photons resonating within the cavity 108 satisfy the condition:

$$E_{g^*} > \frac{hc}{\lambda}$$

$E_{g^*}$ is the electronic bandgap energy of the active segments with an attached target species. As a result, photons are not excited from the valence band into the conduction band of the active segment and the measurable photocurrent is reduced. In other words, the target species can be detected by observing a measurable decrease in the photocurrent produced in response to light resonating in the cavity 108.

In a second embodiment, a target species can be detected by observing a measurable increase in the photocurrent produced by the chemical sensor 1800. The chemical sensor 1800 can be configured as described above and operated as a light-detection device, but the composition of the active segments can be selected so that the electronic band structures of the active segments with and without the attached target species satisfy the condition:

$$E_g > \frac{hc}{\lambda} \geq E_{g^*}$$

In these embodiments, the target species can be detected by observing a measurable increase in the photocurrent produced in response to light resonating in the cavity 108.

Chemical sensor embodiments of the present invention are not limited to the detection of a single target species in an analyte. In other chemical sensor embodiments, the nanowires can be configured to include two or more different active segments and/or the nanowires can be coated with two or more different types of binding sites, where each different type of binding site attaches a particular target species, or the different active segments can each attach a different target species.

VI. Nanowire-Based Light-Detection Devices

Figure 20:
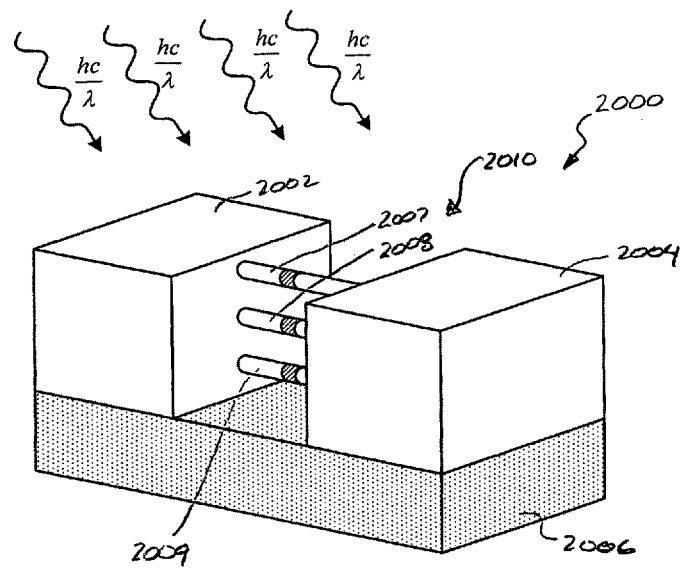
FIG. 20 shows a light-detection device configured in accordance with embodiments of the present invention.

Nanowire-based devices of the present invention can also be configured to operate as high-speed light-detection devices with pico-second response times. FIG. 20 shows a light-detection device 2000 configured in accordance with embodiments of the present invention. The light-detection device 2000 includes two reflective members 2002 and 2004 disposed on an insulated substrate 2006 or insulating region of a substrate and three nanowires 2007-2009 disposed within a cavity 2010. The light-detection device 2000 is operated as a light-detection device when a reverse bias is applied between the two reflective members 2002 and 2004. The first segments adjacent the active segment can be composed of a single uniformly doped p-type semiconductor material or it can be composed of a subsegment near one reflective member that is doped with a p-type dopant and a subsegment to which little or no dopant is intentionally added near the active segment. The second segments adjacent to the active segment can be composed of a single uniformly doped n-type semiconductor material or it can be composed of a subsegment near the other reflective member that is doped with an n-type dopant and a subsegment to which little or no dopant is intentionally added near the active segment 302. The reflective members 2002 and 2004 can be of the same conductivity type as the adjacent nanowire segments. The active segments can be disposed along the nanowires to substantially coincide with the antinodes of the light resonating in the cavity 2010 so that light of near maximum intensity interacts with at least a portion of the active segments. Photons of the incident light satisfying the condition:

$$\frac{hc}{\lambda} \geq E_g$$

where $E_g$ is the electronic bandgap energy of the active segments, generate electron-hole pairs in the active segments when the device is illuminated. The force of the electric field across the active segments creates a measurable photocurrent that can be used to detect photons with energies greater than $E_g$. The light-detection device 2000 can be operated with no applied bias and is said to be operating in the "photovoltaic mode."

In other light-detection device embodiments, the sensitivity and time response of the light-detection device 2000 can be increased when the light-detection device 2000 is operated with a reverse-bias applied between the reflective members 2002 and 2004. The light-detection device 2000 can be configured with any suitable number of nanowires needed to detect light of a particular wavelength. For example, in certain embodiments, the light-detection device 2000 can be configured as a single photon detector by replacing the three nanowires 2007-2009 disposed between the reflective members 2002 and 2004 with a single nanowire. A single photon incident upon the active segment of the nanowire and having energy greater than the electronic bandgap energy of the active segment generates a photocurrent in the reverse-bias light-detection device.

Figure 21:
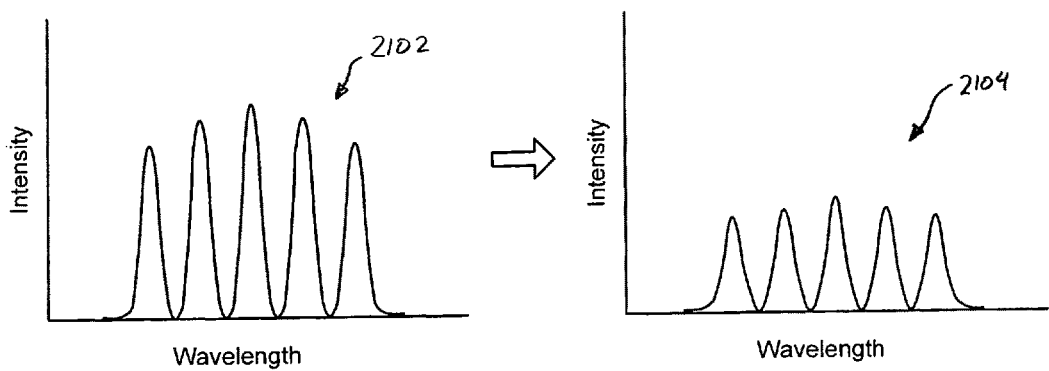
FIG. 21 shows plots representing changes in the intensity of emission spectra of a light-detection device as a result of quenching the gain of lasing active segments in accordance with embodiments of the present invention.

In still other embodiments, the light-detection device 2000 operated in forward bias lasing mode with the active segments of the nanowires 2007-2009 generating an emission spectrum can be used to detect light with wavelengths that fall within the emission spectrum. The light-detection device 2000 can be used to detect light with wavelengths in the emission spectra of the light-detection device 2000 by placing the lasing device 2000 so that the wavelength of the light to be detected is incident on the active segments. When the incident light includes photons with wavelengths that fall within the emission spectrum of the active segments, the intensity of the emission spectrum fluctuates. FIG. 21 shows how an example emission spectrum changes as a result of quenching the gain of lasing active segments of a light-detection device 2000 in accordance with embodiments of the present invention. The intensities of the emission spectrum 2102 produced by the active segments with no incident light is larger than the intensities of the emission spectrum 2104 produced by the active segments as a result of the incident light quenching gain in the active segments of the nanowires.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A nanowire-based device comprising:
a reflective member;
a resonant cavity at least partially enclosed by the reflective member; and
at least one nanowire disposed within the resonant cavity, the nanowire including at least one active segment selectively disposed along the length of the nanowire to substantially coincide with antinodes of light to resonate within the cavity, the active segment to interact with the light to resonate within the cavity.

2. The device of claim 1 wherein the reflective member further comprises Bragg mirrors including alternating layers of low refractive index and high refractive index semiconductor materials.

3. The device of claim 1 wherein the reflective member further comprises semiconductor side walls and reflective surfaces.

4. The device of claim 1 wherein the reflective member further comprises at least one two-dimensional photonic crystal.

5. The device of claim 1 wherein the at least one nanowire further comprises:
a first longitudinal segment comprising an n-type semiconductor material;
a second longitudinal segment comprising a p-type semiconductor material;
a third longitudinal segment comprising the at least one active segment.

6. The device of claim 5 wherein the third longitudinal segment comprising the at least one active segment further comprises intermediate segments that separate two or more active segments, the intermediate segments comprising varying p-type and n-type dopant concentrations.

7. The device of claim 5 wherein the at least one active segment further comprises one or more of:
a quantum dot;
a p-n junction; and
a p-i-n junction.

8. The device of claim 1 wherein the active segment to interact with the light to resonate in the cavity further comprises the active segment composed of a material and having dimensions such that light to resonate within the resonant cavity is absorbed by at least a portion of the active segment.

9. A modulator configured in accordance with the nanowire-based device of claim 1, wherein the modulator includes a voltage source in electrical communication with the reflective member to apply an appropriate bias across the at least one nanowire.

10. The device of claim 9 wherein the appropriate bias further comprises a forward bias that when applied substantially decreases the active segments' absorption of the light to resonate within the resonant cavity.

11. The device of claim 9 wherein the voltage bias further comprises a reverse bias that when applied pumps electrons into the conduction band of the active segments of the nanowires.

12. A chemical sensor configured in accordance with the nanowire-based device of claim 1, wherein the chemical sensor includes at least one binding site selectively disposed along the length of the nanowire to substantially coincide with at least one antinode of the light to resonate within the cavity, the binding site to attach at least one target species of an analyte.

13. The device of claim 12 wherein the at least one active segment includes the at least one binding site that attaches to the at least one target species of the analyte.

14. The device of claim 12 wherein the binding site further comprises atoms, ions, or molecules that coat seating the at least one nanowire or active segment.

15. The device of claim 12 further comprises a change in lasing performance of the chemical sensor when a target species attaches to the binding sites.

16. The device of claim 15 wherein the change in lasing performance of the chemical sensor further comprises one or more of:
a change in pumping power to pump the sensor to maintain substantially constant output;
a shift in the emission spectrum;
a decrease in the intensity of the emission spectrum; and
an increase in the intensity of the emission spectrum.

17. The device of claim 15 further comprises a change in the photocurrent output from the chemical sensor wherein the change in the photocurrent includes one of:
- a decrease in the photocurrent output from the chemical sensor when the target species attaches to the binding sites; and
- an increase in the photocurrent output from the chemical sensor when the target species attaches to the binding sites.

18. A light-detection device configured in accordance with the nanowire-based device in claim 1, wherein the active segments of the at least one nanowires absorb a particular wavelength of light to be detected by the light-detection device.

19. The light-detection device of claim 18 further comprises the device produces a photocurrent in response to the light absorbed by the at least one nanowires within the resonant cavity.

20. The light-detection device of claim 18 wherein when the light to be detected resonates in the resonant cavity, the light quenches gain of the active segments causing fluctuations in the intensity of an emission spectrum produced by the active segments.

* * * * *

UNITED STATES PATENT AND TRADEMARK OFFICE
CERTIFICATE OF CORRECTION

| | |
|---|---|
| PATENT NO. | : 7,924,413 B2 |
| APPLICATION NO. | : 12/074133 |
| DATED | : April 12, 2011 |
| INVENTOR(S) | : R. Stanley Williams et al. |

It is certified that error appears in the above-identified patent and that said Letters Patent is hereby corrected as shown below:

In column 20, line 55, in Claim 14, after "coat" delete "seating".

Signed and Sealed this
Twenty-ninth Day of November, 2011

David J. Kappos
*Director of the United States Patent and Trademark Office*